United States Patent
Yoshino et al.

(10) Patent No.: US 6,241,839 B1
(45) Date of Patent: Jun. 5, 2001

(54) CONTINUOUS VACUUM LAMINATION TREATMENT SYSTEM AND VACUUM LAMINATION APPARATUS

(75) Inventors: Takehito Yoshino; Kimitoshi Fukae; Yuji Inoue; Shigenori Itoyama, all of Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/245,310

(22) Filed: Feb. 5, 1999

Related U.S. Application Data

(62) Division of application No. 08/907,613, filed on Aug. 8, 1997, now Pat. No. 5,993,582.

(30) Foreign Application Priority Data

Aug. 13, 1996 (JP) .................................. 8-229423
Aug. 13, 1996 (JP) .................................. 8-229424

(51) Int. Cl.[7] .................. B32B 31/12; B32B 31/20; B29C 65/02
(52) U.S. Cl. .................. 156/91; 156/153; 156/290; 156/382; 156/499; 156/583.3
(58) Field of Search .................. 156/153, 91, 281, 156/290, 382, 583.3, 499, 285, 286

(56) References Cited

U.S. PATENT DOCUMENTS

| | | | |
|---|---|---|---|
| 2,837,453 | 6/1958 | Englehart et al. | 156/104 |
| 3,912,542 | 10/1975 | Hirano et al. | 156/104 |
| 4,601,772 | 7/1986 | McKelvey | 156/382 |
| 5,238,519 | 8/1993 | Nath et al. | 156/382 |
| 5,593,532 | 1/1997 | Falk et al. | 156/285 |

OTHER PUBLICATIONS

Kennedy, Gower A., Welding Technology, Howard W. Sams & Co., Inc., pp. 117, 672, 1974.*

* cited by examiner

*Primary Examiner*—Jeff H. Aftergut
*Assistant Examiner*—Michael A. Tolin
(74) *Attorney, Agent, or Firm*—Fitzpatrick, Cella, Harper & Scinto

(57) ABSTRACT

The present invention relates to a vacuum lamination apparatus suitable for vacuum-laminating a stacked body. The vacuum lamination apparatus includes a mounting table including a metal plate having a front surface on which the stacked body is to be positioned. The apparatus also includes a vacuuming pipe comprising a looped hollow pipe having an inside circumference and a plurality of vents spacedly perforated at the inside circumference thereof. The vacuuming pipe is arranged in and fixed to the front surface of the metal plate. The front surface of the metal plate has a front surface with a center line average height of 0.2 to 1.5 μm. The vacuuming pipe is fixed to the front surface of the metal plate by intermittently welded portions provided at a contact region between the front surface of the metal plate and the vacuuming pipe. A sealant is disposed to the entire contact region, whereby the vacuuming pipe and the metal plate are integrated.

5 Claims, 13 Drawing Sheets

CONTINUOUS VACUUM LAMINATION TREATMENT SYSTEM AND VACUUM LAMINATION APPARATUS

This is a division of application Ser. No. 08/907,613, filed Aug. 8, 1997, now U.S. Pat. No. 5,993,582.

BACKGROUND OF THE INVENTION

1. Field of the invention

The present invention relates to a continuous vacuum lamination treatment system and a vacuum lamination apparatus. More particularly, the present invention relates to a continuous vacuum lamination treatment system which enables to mass-production of a solar cell module at a high throughput and a vacuum lamination apparatus suitable for producing a solar cell module.

2. Related Background Art

There are known various vacuum lamination apparatus used at a final stage in the production of semiconductor devices such as solar cells and the like which are used while exposed to outside air, in order to seal such semiconductor device such that it is sufficiently durable against changes in the environmental temperature and humidity and also against impact or destructive force applied thereto. Solar cell modules produced through these vacuum lamination apparatus are used as a power generation source of providing clean energy without causing pollution.

In recent years, earth environmental pollution has been spreading worldwide, and along with this, the public consciousness for earth environmental protection has been increasing on a worldwide scale. Particularly, serious apprehensions has arisen regarding heating the earth because of the so-called greenhouse effect due to an increase of atmospheric $CO_2$. In this connection, there is an increased social demand for early realization of a power generation system capable of providing clean energy without causing $CO_2$ buildup as in the case of thermal power generation.

Under this situation, public attention has focused on the power generation system using a solar cell since the solar cell has advantages such that it is safe, can be readily handled and that it can be used as a power generation source of providing clean energy without causing $CO_2$ buildup. And various studies have been made in order to produce a highly reliable solar cell with a reasonable production cost. In the production of such solar cell, the foregoing vacuum lamination apparatus pays an important role.

Incidentally, there have been proposed a variety of solar cells which are different in terms of the type and configuration. Representative specific examples of these solar cells are single crystal silicon solar cells, polycrystal silicon solar cells, amorphous silicon solar cells, copper indium selenide solar cells, and compound semiconductor solar cells. Of these solar cells, various research and development studies have been made on so-called thin film crystal silicon solar cells, compound semiconductor solar cells and amorphous silicon solar cells since they can be relatively easily produced to have a large area at a relatively low production cost.

In order to practically use these solar cells as a power generation source, for instance, in outdoors, they are designed into a solar cell module having a desired configuration which can be used as a power generation source.

FIGS. 13(a) and 13(b) are schematic views illustrating an example of the configuration of such a solar cell module. Particularly, FIG. 13(a) is a schematic cross-sectional view illustrating an example of the constitution of a laminate comprising given constituent members for a solar cell module and which is to be subjected to thermocompression treatment in order to produce a solar cell module. FIG. 13(b) is a schematic cross-sectional view illustrating a stacked body as a solar cell module obtained as a result of having subjected the laminate shown in FIG. 13(a) to thermocompression treatment. In FIGS. 13(a) and 13(b), reference numeral 1001 indicates a surface side covering member, reference 1002 a filler, reference numeral 1003 a solar cell (or a photovoltaic element), and reference numeral 1004 a back side covering member.

The above solar cell module is prepared, for instance, as will be described in the following. First, the foregoing constituent members for a solar cell are laminated to obtain such a laminate as shown in FIG. 13(a). The laminate thus obtain is introduced into a vacuum lamination apparatus, where the laminate is positioned therein while being hermetically enclosed, followed by vacuuming the inside of the laminate to release air present in the laminate to the outside. Then, while continuing the vacuuming operation, the laminate is subjected to heat treatment, where the laminate is heated to a predetermined temperature at which the fillers are crosslinked or cured. This heat treatment is continued at this temperature for a prescribed period of time until the fillers are sufficiently cured, followed by cooling the laminate thus treated. After this, the vacuuming operation is terminated to return the atmosphere surrounding the laminate to atmospheric pressure, followed by taking out the laminate. By this, a solar cell module having the configuration shown in FIG. 13(b) is obtained.

FIGS. 14(a) through 14(c) are schematic diagrams illustrating a conventional vacuum lamination apparatus which is used for the production of a solar cell module. Particularly, FIG. 14(a) is a schematic diagram illustrating the entire vacuum lamination apparatus, FIG. 14(b) is a schematic cross-sectional view, taken along the F—F line in FIG. 14(a), and FIG. 14(c) is a schematic cross-sectional view illustrating a structural embodiment provided upon producing a solar cell module.

In FIGS. 14(a) through 14(c), reference numeral 1101 indicates a mounting table having a mounting area A on which a stacked body (or a laminate) 1108 for a solar cell module is to be positioned. Reference numeral 1102 indicates a vacuuming tube which is provided with a plurality of vents 1105 and which is arranged so as to circumscribe the mounting area A of the mounting table 1101. Reference numeral 1103 indicates a valve provided at an exhaust pipe 1110 which is communicated with the vacuuming tube 1102 at one end thereof and which is connected to a vacuuming pump 1104 at the other end thereof. Reference numeral 1106 indicates a fixing means to fix the vacuuming tube 1105 to the mounting table 1101. Reference numeral 1107 indicates a flexible covering member, and reference numeral 1109 a netted member.

The preparation of a solar cell module using the vacuum lamination apparatus shown in FIGS. 14(a) through FIG. 14(c) is conducted, for instance, in the following manner. The netted member 1109 is laid on the surface of the mounting area A of the mounting table 1101. A stacked body (or a laminate) for producing a solar cell module as the stacked body 1108 (see, FIG. 14(c)) is positioned on the netted member 1109 laid on the mounting area A. The flexible covering member is superposed over the stacked body 1108 on the mounting table 1101 while hermetically sealing between the mounting table and the flexible covering member. The vacuuming pump 1104 is-actuated to exhaust the inside of the space containing the stacked body 1108 between the flexible covering member 1107 and the mounting area A circumscribed by the vacuuming tube 1105 through the vents 1105 of the vacuuming tube, whereby the flexible covering member 1107 is sagged toward the mounting table side to compress the stacked body 1108. While operating the vacuuming pump 1104, the lamination apparatus is introduced into an oven (not shown) maintained at a predetermined temperature, where the stacked body is subjected to heat treatment at a temperature at which the fillers contained in the stacked body are cured This heat treatment is continued until the fillers of the stacked body are sufficiently cured. After this, while continuing the operation of the vacuuming pump, the lamination apparatus is taken out from the oven, followed by cooling the stacked body. Then, the operation of the vacuuming pump is terminated to return the inside atmosphere of the foregoing space to atmospheric pressure. By this, the preparation of a solar cell module is completed.

This conventional vacuum lamination apparatus has advantages such that the scale of the apparatus can be readily adjusted depending upon the size of a solar cell module to be prepared since the structure thereof is relatively simple, specifically, for instance in the case of preparing a solar cell module having a large area, it can be readily enlarged; since the calorific capacity of the apparatus is small, the constituent materials of a stacked body for a solar cell module can be heated to a desired temperature within a short period of time; and the period of time required for the preparation of a solar cell module can be shortened.

Although the conventional vacuum lamination apparatus has such advantages as above described, it has such shortcomings as will be described in the following, for example, in a case of mass-producing a large area solar cell module and therefore, it is not suitable in the case of mass-producing such large area solar cell module.

In order for the production system to mass-produce a large area solar cell module, it is required to have a large-sized heating oven capable of accommodating a large-sized vacuum lamination instrument (or a large-sized vacuum lamination apparatus) therein, which is the largest in terms of the plant and equipment investment.

Particularly in this respect, the vacuum lamination treatment in the production of a solar cell module comprises (1) laminating constituent members for the production of a solar cell module, (2) vacuuming a stacked body obtained in the step (1), (3) heating the vacuumed stacked body, (4) cooling the heat-treated stacked body, and (5) taking out the stacked body cooled in the step (4). The heating oven is used in only one of these five steps, i.e., the heat treatment step (3). In order for the heating oven to be most efficiently utilized in the production system to mass-produce a solar cell module, it is necessary that a plurality of vacuum lamination instrument (or vacuum lamination apparatus) are provided, each lamination instrument is designed such that it can quickly and efficiently travel each of the foregoing steps, and the entire of the system is optimized. In the case where the solar cell module to be mass-produced is of a large area, each lamination instrument is required to have a large size suited for the solar cell module. The large-sized lamination instrument is heavy and difficult to handle.

By the way, in the foregoing vacuum lamination apparatus shown in FIGS. 14(a) through 14(c), the fixing means 1106 is used for fixing the vacuuming tube 1102 to the mounting table 1101 so that no clearance occurs between the vacuuming tube and the mounting table. The vacuum lamination apparatus is exposed to an atmosphere with a high temperature while the inside thereof being vacuumed in the production of a solar cell module. Therefore, the fixing means 1106 is required to be sufficiently heat-resistant. In the prior art, the vacuuming tube is fixed to the mounting table by way of welding or by means of a sealant such as RTV (room temperature vulcanization) curing type silicone sealant by which the clearance between the vacuuming tube and the mounting table is filled to fix the former to the latter. In these fixing manners, as long as the size of the mounting table and that of the vacuuming tube are small, specifically, their long sides are less than 1 m, no problem entails.

However, in recent years, there is an increased demand for a production system capable of efficiently mass-producing a large area solar cell with a reasonable production cost, wherein the mounting table and the vacuuming pipe of the vacuum lamination apparatus used are required to be large-sized.

The foregoing conventional vacuum lamination apparatus does not sufficiently satisfy this demand. That is, in the case where the mounting table and the vacuuming tube are large-sized, when the large-sized vacuuming tube is fixed to the large-sized mounting table by any of the foregoing fixing manners, such problems exits, as will be described below.

When the fixing manner by way of welding is employed, due to heat distortion upon the welding, the resulting vacuum lamination apparatus becomes such that is distorted.

When the fixing manner by means of the sealant, though such problem occurred in the case of the fixing manner by way of welding, there is a tendency of entailing such problems as will be described in the following. Ordinarily, the mounting table of the vacuum lamination apparatus is transported to a given step in the lamination treatment process by loading it on a specialized tool or container, and therefore, there is no problem. However, in the case of taking the mounting table away from the specialized tool or container for the purpose of apparatus maintenance, a problem is liable to entail in that the mounting table is deformed at a certain extent because the mounting table is large in size. In this case, another problem is liable to entail in that the fixing means comprising the sealant:, which is more soft than the welded fixing means, is sometimes cracked. When the fixing means is cracked, a problem occurs in that the space in the vacuum lamination apparatus cannot be vacuumed as desired and as a result, the lamination treatment for a stacked body for the production of a solar cell module cannot be conducted as desired.

SUMMARY OF THE INVENTION

An object of the present invention is to solve the foregoing problems relating to the utilization efficiency of the heating oven and the handling of the vacuum lamination instrument in the prior art in the case of mass-producing a large area solar cell module by a vacuum lamination process and to provide a continuous vacuum lamination treatment system which enables to efficiently mass-produce a large area solar cell module at a high throughput.

Another object of the present invention is to achieve a large-sized vacuum lamination apparatus in which the mounting table and the vacuuming pipe are large-sized without the foregoing problems in the case of large-sizing the mounting table and the vacuuming pipe in the conventional vacuum lamination apparatus.

An aspect of the present invention is directed to a continuous vacuum lamination treatment system of continuously conducting at least (1) a lamination (or stacking) step of stacking a back side covering member, a first filler member, a member (such as a solar cell) to be sealed, a second filler member, and a surface side covering member in the named order to form a stacked body, (2) a vacuuming step of decompressing a region of the stacked body which is sandwiched by the surface side covering member and the back side covering member, and (3) a heating step of subjecting the stacked body treated in the vacuuming step (2) to heat treatment at a desired temperature in the named order, characterized in that the lamination step (1) is conducted on a plurality of vacuum lamination instruments having a structure capable of loading at several stages in the vertical direction and also capable of unloading by means of loading and unloading means; a plurality of work areas including at least (a) a lamination work area used in the lamination step (1), (b) a loading work area having a loading means, (c) a vacuuming work area having a vacuuming pump which is used in the vacuuming step (2), (d) a heating work area having a heating oven which is used in the heating step (3), and (e) an unloading work area having an-unloading means which are arranged in a circle-like arrangement while neighboring to each other; each of the lamination instruments is capable of optionally traveling to each work area and also among the loading and unloading means; wherein vacuum lamination treatment for the stacked bodies on the vacuum lamination instruments is continuously conducted while moving the lamination instruments to successively travel the work areas (a) through (e) in the named order.

Another aspect of the present invention is directed to a vacuum lamination apparatus usable as the vacuum lamination instrument in the above described continuous vacuum lamination treatment system, said vacuum lamination apparatus comprising (i) a vacuuming pipe comprising a looped hollow pipe having a plurality of vents spacedly perforated at an inside circumference thereof, (ii) a mounting table to which said vacuuming pipe is fixed, and (iii) a sheet-like covering member, wherein said covering member (iii) is superposed over the front surface of said mounting table (ii) while covering said vacuuming pipe (i) to form a space circumscribed by said covering member, said vacuuming pipe and the front surface of said mounting table in which an object is to be enclosed, characterized in that the vacuuming pipe is fixed to the mounting table by means of intermittently welded portions provided at a contact region between the mounting table and the vacuuming pipe and a sealant disposed to the entire of said contact region.

DESCRIPTION F THE INVENTION AND PREFERRED EMBODIMENTS

Figure 1:
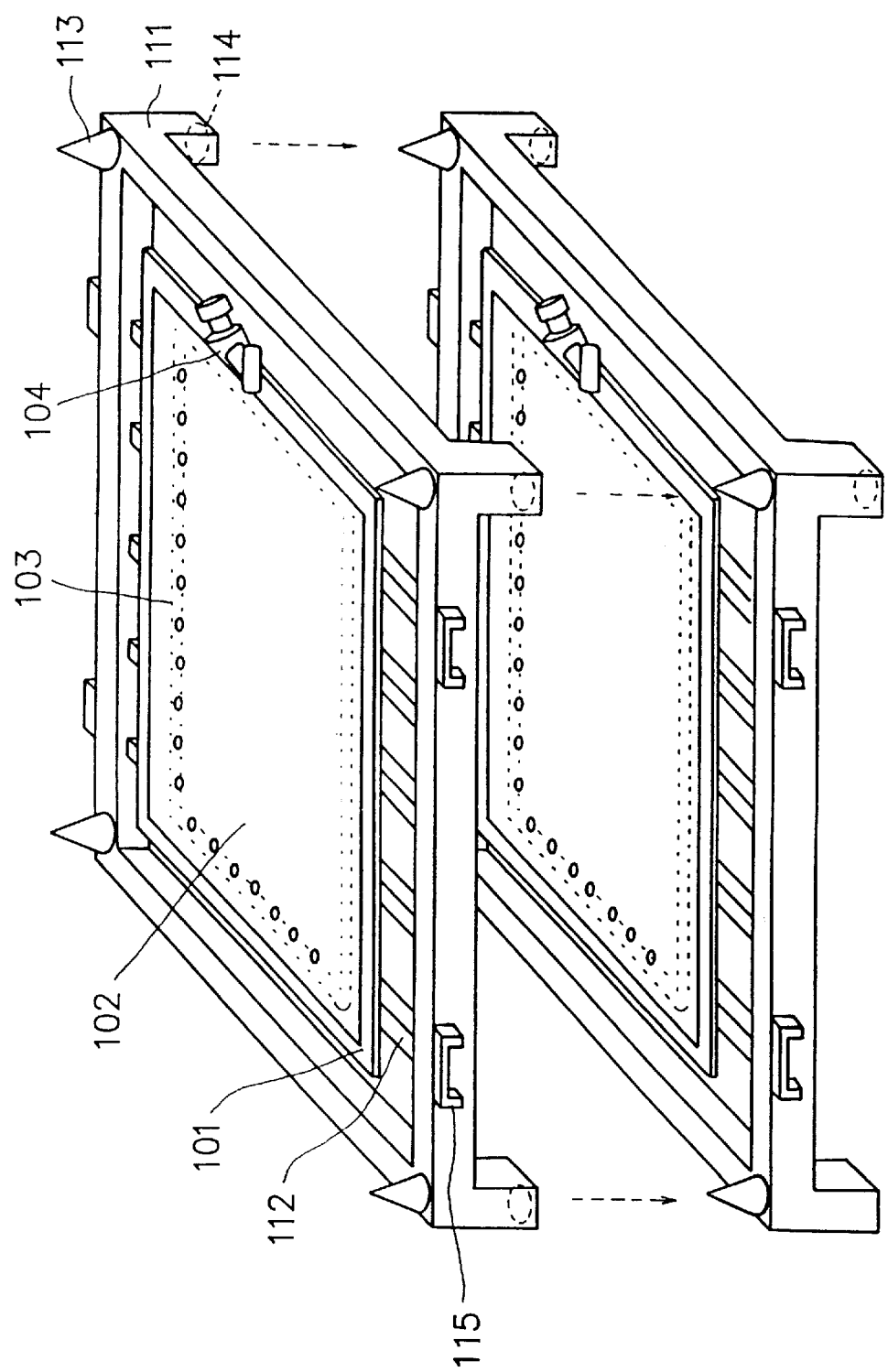
FIG. 1 is a schematic diagram illustrating an example of a vacuum lamination instrument (or a vacuum lamination apparatus) capable of optionally loading or unloading, which is used in the continuous vacuum lamination treatment system according to the present invention.

In the following, the present invention will be detailed while referring to the drawings.

FIG. 1 is a schematic diagram illustrating an example of a vacuum lamination instrument (or a vacuum lamination apparatus) capable of optionally loading or unloading, which is used in the continuous vacuum lamination treatment system according to the present invention.

In FIG. 1, reference numeral 101 indicates a mounting table (which corresponds to the mounting table explained in the foregoing description of the prior art) on which members to be laminated are to be stacked. Reference numeral 102 indicates a silicone rubber sheet (which corresponds to the covering member explained in the foregoing description of the prior art). Reference numeral 103 indicates a vacuuming pipe or members to be stacked, situated under the covering member 102. Reference numeral 104 indicates a vacuuming pipe or connection means.

Reference numeral 111 indicates a container provided with a ladder 112 which serves to accommodate the mounting table 101 thereon while supporting the mounting table by the ladder. Reference numeral 113 indicates a positioning guide pin, and reference numeral 114 indicates a guide pin receiver.

The respective containers 111 are optionally loaded or unloaded by means of a loading and unloading apparatus for which explanation will be later made. In the loading and unloading apparatus, when the position of the corresponding container is roughly decided and then the loading work therefor is commenced, the container can be automatically loaded at a precise position by the action of the guide pin 113, where the container once loaded is prevented from shifting by means of the guide pin 113 and the guide pin receiver 114.

Reference numeral 115 indicates a protrusion which is used in the case where the container 111 is caught by a supporting hook in the loading and unloading apparatus. This situation will be later detailed.

Now, the vacuum lamination instrument shown in FIG. 1 will be described in more detail.

It is desired for the mounting table 101 to be constituted by a material having a sufficient physical strength and having a low calorific capacity. In a preferred embodiment, the mounting table 101 comprises a steel plate applied with a corrosion-resistant coat to the surface thereof and which has a thickness preferably in the range of 0.3 to 3.0 mm or more preferably in the range of 1.5 to 2.0 mm. It is important for the mounting table to have a low calorific capacity in order for the mounting table to be quickly heated in the heating oven and also to be quickly cooled after the completion of the heat treatment in the heating oven. The ladder 112 is used for maintaining the mounting table 101 in a semi-hollow atmosphere in order for the mounting table to quickly acclimate with an ambient temperature upon heating or cooling the mounting table. The ladder 112 is designed to have a low calorific capacity and a sufficient physical strength.

The guide pin receiver 114 is designed to have such a height that the mounting table 101, the covering member 102 (the silicone rubber sheet), and the vacuuming pipe and the like can desirably fall between adjacent two containers 111 when one of these containers is loaded on the other. The container 111 is desired to be constituted by a light weight steel member having a sufficient physical strength.

The vacuuming pipe 103 serves to vacuum the space circumscribed by the front surface of the mounting table, the vacuuming pipe and the covering member. The vacuuming pipe comprises a looped hollow pipe provided with a plurality of vents spacedly arranged on an inside circumference thereof. The vacuuming pipe is required to be sufficiently heat resistant, rigid, and light weight. Therefore, the looped hollow pipe as the vacuuming tube is usually constituted by a stainless steel. The foregoing vents are desired to be perforated at the hollow pipe as the vacuuming pipe prior to the fabrication of the vacuum lamination instrument. It is possible for the hollow pipe as the vacuuming pipe to be bonded to the mounting table. In this case, it is desired for the hollow pipe to be degreased prior to bonding to the mounting table. For the size of the hollow pipe as the vacuuming pipe, it is made such that it can fall within the front surface of the mounting table. The hollow pipe as the vacuuming pipe is provided with a port and a valve for connecting the hollow pipe to a vacuuming pump. The hollow pipe as the vacuuming pipe is fixed to the mounting table in a manner of welding the former to the latter or in a manner of filling the clearance between the hollow pipe and the mounting table by a sealant such as RTV curing type silicone sealant.

The silicone rubber sheet 102 as the covering member is used for the purpose of establishing a vacuuming space circumscribed by the front surface of the mounting table, the vacuuming pipe and the silicone rubber sheet. The silicone rubber sheet is used also for the purpose of compressing a stacked body comprising, constituent members for a solar cell module which is enclosed in the vacuuming space in a vacuumed state to deaerate the stacked body.

The silicone rubber sheet 102 is designed to have a size which is greater than that of the outside frame of the vacuuming pipe 103. Isle silicone rubber sheet is required to be flexible, heat resistant and light weight and to have an airtight sealing property when vacuuming is conducted. In this connection, the silicone rubber sheet 102 is constituted principally by a silicone resin, and it is shaped in a sheet-like form.

As previously explained in the foregoing description of the prior art, a netted member is laid on the front surface of the mounting table 101. The netted member is used for facilitating air flow in the case of deaerating the stacked body comprising constituent members for a solar cell module by way of vacuuming. Particularly, the netted member is positioned between the front surface of the mounting table 101 and the silicone rubber sheet 102 in the foregoing vacuuming space in order to prevent occurrence of a problem of blockading -air from smoothly flowing when the silicone rubber sheet 102 is undesirably contacted with the front surface of the mounting table 101. The netted member is designed to have a size corresponding to the internal size of the circular form established by the vacuuming pipe 103. The netted member is required to be flexible, heat resistant and light weight. In this respect, as the netted member, there is used a wire netting or a netted member made of a heat resistant resin fiber of polyester or the like.

Figure 2:
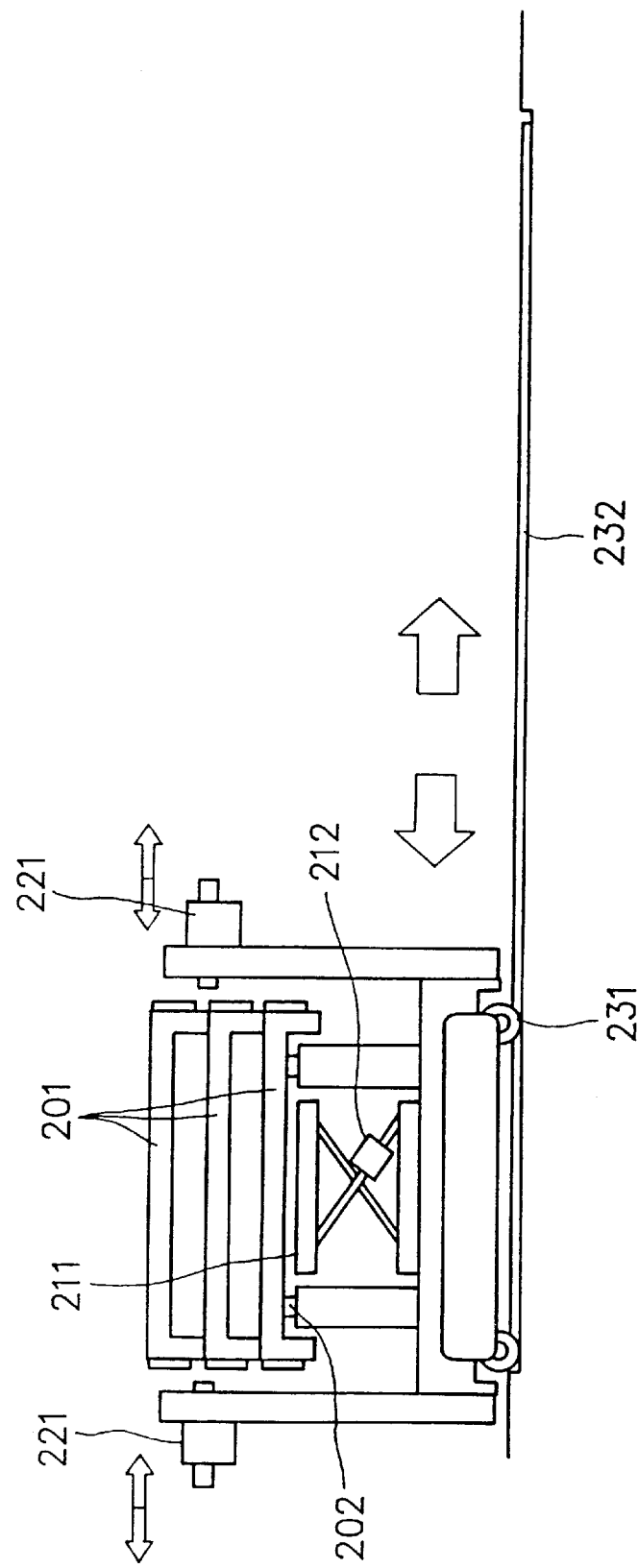
FIG. 2 is a schematic diagram illustrating an example of a loading and unloading apparatus capable of conducting loading and unloading of the vacuum lamination instrument in the continuous vacuum lamination treatment system according to the present invention.

FIG. 2 is a schematic diagram illustrating an example of a loading and unloading apparatus capable of conducting loading and unloading of the vacuum lamination instrument in the continuous vacuum lamination treatment system according to the present invention.

In FIG. 2, reference numeral 201 indicates a vacuum lamination instrument (or a vacuum lamination apparatus) of the same constitution as that of the vacuum lamination instrument shown in FIG. 1. Reference numeral 202 indicates a circular roller. The vacuum lamination instrument 201 usually moves over this roller 202 in the vertical direction on FIG. 2. Reference numeral 211 indicates a lifter, and reference numeral 212 a cylinder. The lifter 211 ascends or descends in accordance with expansion or contraction of the cylinder 212. When the vacuum lamination instrument 201 is positioned on the lifter 211 and the lifter 211 is ascended, the front face of the lifter 211 is contacted with the rear face of the vacuum lamination instrument 201, whereby the vacuum lamination instrument can be ascended. Reference numeral 221 indicates a hook which can slidably move in the lateral direction on FIG. 2. When the hook 221 is in a housed state, the vacuum lamination instrument 201 can be freely ascended and descended. The movement of the vacuum lamination instrument 201 herein corresponds to the ascent and descent of the lifter 211. on the other hand, when the hook 221 is in an operative state, the hook is engaged in mesh with the protrusion 115 in FIG. 1, where the vacuum lamination instrument is prohibited from descending. Reference numeral 231 indicates a caster which moves on a rail 232. The entire loading and unloading apparatus can move in either of directions shown by arrow marks in FIG. 2 depending upon the movement of the caster 231 on the rail 232.

In the following, description will be made of the operation of loading and unloading the foregoing vacuum lamination instrument using the above described loading and unloading apparatus while referring to FIG. 3.

Figure 3:
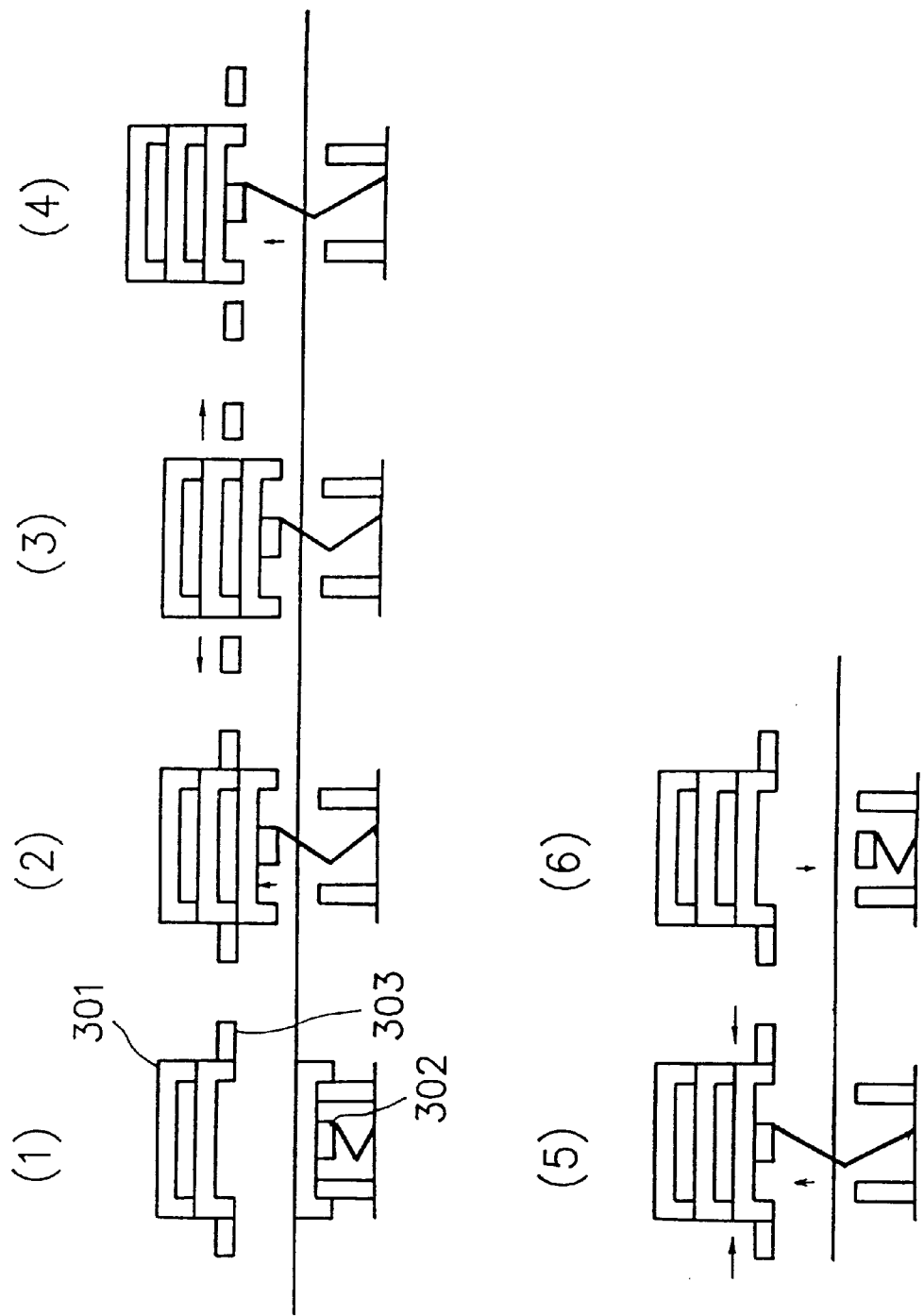
FIG. 3 is a schematic view for explaining the performance of the loading and unloading apparatus shown in FIG. 2 in the case of loading and unloading the vacuum lamination instrument.

In FIG. 3, reference numeral 301 indicates the foregoing vacuum lamination instrument, reference numeral 302 the foregoing lifter, and reference numeral 303 the foregoing hook.

The operation of successively loading a plurality of vacuum lamination instruments proceeds in the order of steps (1) to (6) shown in FIG. 3.

Description will be made of the situation of each of the steps (1) to (6) shown in FIG. 3.

The step (1) shows an initial stage in that two vacuum lamination instruments 301 already have been held on the hook 303, and a next vacuum lamination instrument to be loaded is positioned on the lifter 302 which has been moved on the roller (see, 202 in FIG. 2).

The step (2) shows a second stage in that the lifter is ascended until the upper end of the next vacuum lamination instrument contacts with the lower end of the vacuum lamination instrument positioned on the hook.

The step (3) shows a third stage in that the hook is housed, whereby the loads of all the vacuum lamination instruments transfer to the lifter.

The step (4) shows a fourth stage in that the lifter is ascended at a height corresponding to the height of one vacuum lamination instrument.

The step (5) shows a fifth stage in that the hook is taken out to be in a operative state, whereby the loads of all the vacuum lamination instruments transfer onto the hook.

The step (6) shows a sixth stage in that the lifter is descended.

By this, the loading operation is completed. Herein, description of the unloading operation is omitted, since the unloading operation can be conducted by reversing the above procedures.

Figure 4:
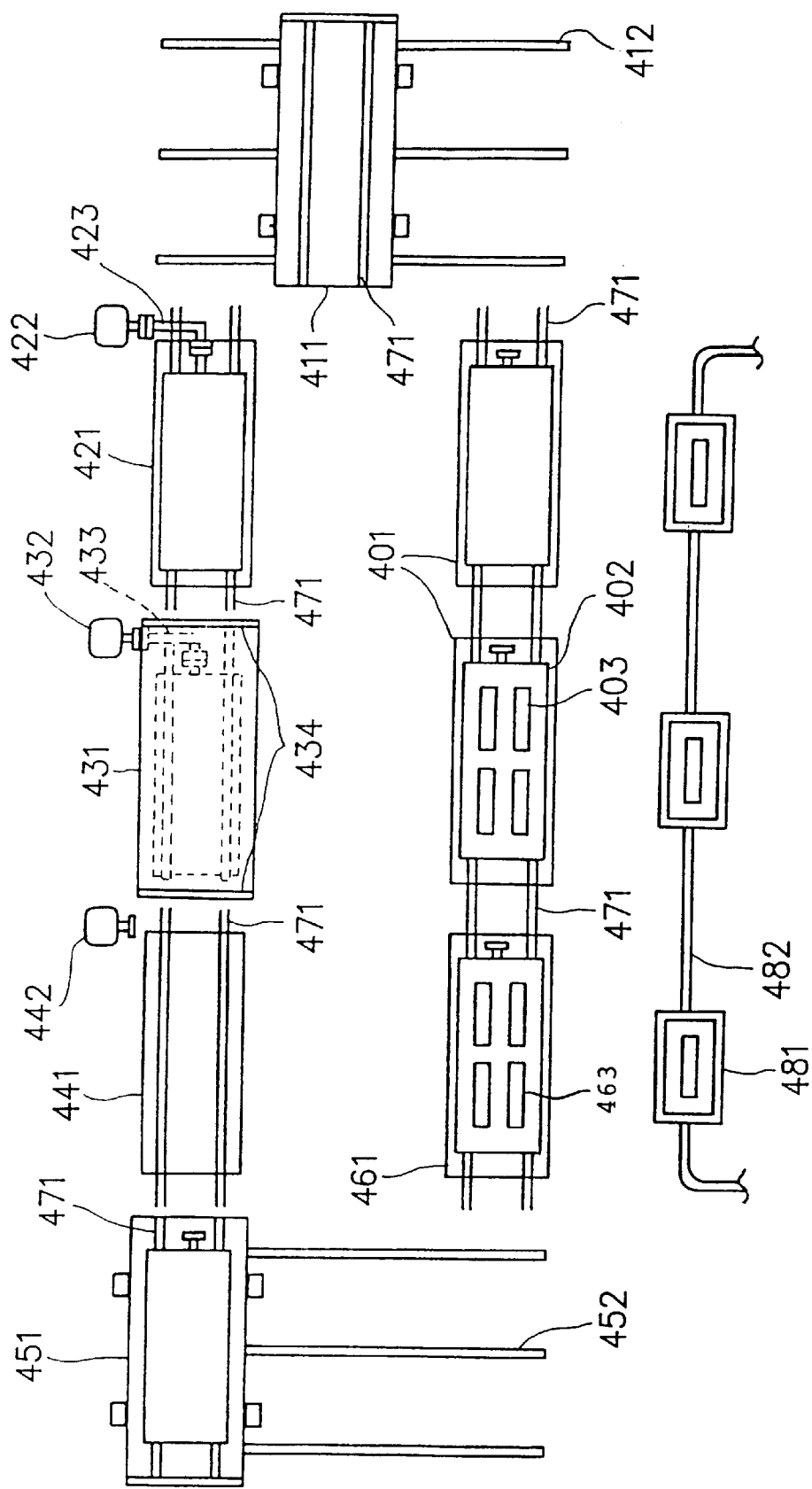
FIG. 4 is a schematic arrangement plan illustrating an embodiment in which the respective work areas used for practicing the continuous vacuum lamination treatment system according to the present invention are arranged in a circle-like arrangement.

FIG. 4 is a schematic arrangement plan illustrating a typical embodiment of the continuous vacuum lamination treatment system according to the present invention in which the respective work areas used for practicing the continuous vacuum lamination treatment process are arranged in a circle-like arrangement. Particularly, a material-stacking work area, a provisionally vacuuming work area, a heating work area, a cooling work area, and a taking-out work area are arranged in a circle-like arrangement.

In FIG. 4, reference numeral 401 indicates a material-stacking work area, and reference numeral 402 a vacuum lamination instrument: having the same constitution as the vacuum lamination instrument shown in FIG. 1. In this material-stacking work area, a plurality of members 403 to be laminated are stacked to form a stacked body on the vacuum lamination instrument 402.

Reference numeral 411 indicates a loading and unloading apparatus which has the same constitution as the loading and unloading apparatus shown in FIG. 2. And reference numeral 421 indicates a provisionally vacuuming work area. The loading and unloading apparatus 411 can move along a rail 412 to neighbor to both the material-stacking work area 401 and the vacuuming work area 421.

In the vacuuming work area 421, a vacuuming pump 422 and a detachable flexible vacuuming hose 423 are provided.

Reference numeral 431 indicates a heating work area which substantially comprises a heating oven. The heating oven herein has a space capable of accommodating a body comprising a necessary number of vacuum lamination instruments being loaded therein. The heating oven is provided with a door 434 at each of the opposite ends. Reference numeral 432 indicates a vacuuming pump. The vacuuming pump 432 is connected to a flexible vacuuming hose 433 which penetrates the wall of the heating oven to extend in the heating oven and which can be optionally connected to and detached from the vacuum lamination instrument.

Reference numeral 441 indicates a cooling work area which is provided with a vacuuming pump 442. Reference numeral 451 indicates a loading and unloading apparatus having the same constitutions as the loading and unloading apparatus shown in FIG. 2. Reference numeral 461 indicates a taking-out work area.

The loading and unloading apparatus 451 can move along a rail 452 to neighbor to both the cooling work area 441 and the taking-out area 461.

Reference numeral 463 indicates a solar cell module obtained as a result of the vacuum lamination treatment. The solar cell module 463 is taken out from the vacuum lamination instrument in the taking-out work area 461.

Reference numeral 471 indicates a conveyor having a circular roller. The conveyor 471 is provided between every adjacent work area so that either a single vacuum lamination instrument or a pile of plural vacuum lamination instruments can freely travel between the adjacent work areas.

Reference numeral 481 indicates a container which is used for transporting members to be stacked to the material-stacking work area 401 or for recovering a solar cell module 463 obtained as a result of the vacuum lamination treatment which has been taken out in the taking-out work area 461. The container 481 moves on a rail 482. The rail 482 is extending to a preparatory area (not shown in the figure) for making preparations for members to be stacked.

In the following, description will be made of a typical embodiment of the continuous vacuum lamination treatment system according to the present on the basis of FIG. 4.

A solar cell module 463 obtained as a result of the vacuum lamination treatment which is situated on a first vacuum lamination instrument is taken out in the taking-out work area, and the empty vacuum lamination instrument is transported to the material-stacking area 401, simultaneously with this, members to be staked for the production of a solar cell module, e.g., a back side covering member, a first filler member, a solar cell, a second filler member, a surface side covering member, a filler antirunning material, and a silicone rubber sheet as the foregoing covering member for establishing the vacuuming space, are transported to this work area by the container 481, where these members thus transported are stacked to form a stacked body on the front surface of said empty vacuum lamination instrument; in such a state as previously described.

At the initial stage, the loading and unloading apparatus 411 is situated at a position in the vicinity of the material-stacking work area 401. The above first vacuum lamination instrument having the stacked body formed by stacking the foregoing members is slidably moved on the conveyor 471 to arrive in the loading and unloading apparatus 411. After this, by conducting the loading work once, the first vacuum lamination instrument is positioned on the hook (not shown in the figure) in the loading and unloading apparatus. Successively, a second vacuum lamination instrument having, thereon, a stacked body formed by stacking the foregoing members as in the case of the first vacuum lamination instrument is moved in the loading and unloading apparatus, where by again conducting the loading work, the second vacuum lamination instrument is piled on the first vacuum lamination instrument previously positioned on the hook. In this way, a predetermined number of vacuum lamination instruments each having a stacked body formed by stacking necessary members for the production of a solar cell module are loaded to obtain a pile having several stages with respect to the vacuum lamination instrument. For the number of the stages for the vacuum lamination instruments to be loaded (piled), it should be properly determined depending upon the situation involved, while having a due care so that the maximum height of the resulting pile is such that the pile can be desirably accommodated in the heating oven. In addition, the number of the stages for the vacuum lamination instruments to be loaded should be determined so as to match an optimum process design derived from the related factors including the heating time in the heat treatment, the total number of usable vacuum lamination instruments, and the tact time for stacking necessary members for the production of a solar cell module.

The entire loading and unloading apparatus, in which several vacuum lamination instruments have been loaded (piled) into a pile with necessary stages in the above described manner, is moved to a position in the vicinity of the vacuuming work area 421.

Thereafter, using the lifter, all of the vacuum lamination instruments are descended to the level of the conveyor 471, followed by moving them into the vacuuming work area 421, where the flexible vacuuming hose 423 is connected to the vacuum lamination instruments, and the vacuuming pump 422 is actuated, whereby the vacuuming space between the front surface of the mounting table and the silicone rubber sheet for each vacuum lamination instrument, is evacuated to deaerate the stacked body contained in the vacuuming space.

Then, while maintaining each vacuum lamination instrument in a vacuumed state by using a valve (not shown in the figure), the flexible vacuuming hose 423 is detached, the door 434 of the heating oven in the heating work area 431 is opened, and the vacuum lamination instruments are moved into the heating work area 431. In this heating work area, the flexible vacuuming hose 433 is connected to each vacuum lamination instrument, and the vacuuming pump 432 is actuated and a valve (not shown in the figure) is opened, whereby the deaeration of the stacked body contained in the vacuuming space of each vacuum lamination instrument is continued. The door 434 is closed, and the heater (not shown in the figure) of the heating oven is energized to heat each vacuum lamination instrument for a predetermined period of time, whereby heat lamination treatment for the stacked body in each vacuum lamination instrument is completed. After this, the heater is terminated, and the door 434 is opened. The valve is closed, and while maintaining each vacuum lamination instrument in a vacuumed state, the flexible vacuuming hose 433 is detached.

Thereafter, the vacuum lamination instruments are moved into the cooling work area 441. In this cooling work area, while continuing the evacuation of the vacuuming space of each vacuum lamination instrument by means of the vacuuming pump 442, each vacuum lamination instrument is cooled. In this case, it is desired that by using a fan or the like, cold air is forced to flow between each adjacent vacuum lamination instruments to shorten the cooling period time.

After the vacuum lamination instruments are cooled to have a temperature capable of being handled in the cooling work area 441, the loading and unloading apparatus 451 is moved to a position in the vicinity of the cooling work area 441, and the vacuum lamination instruments are transferred into the loading and unloading apparatus. Then, the loading and unloading apparatus is moved to a position in the vicinity of the taking-out work area 461, where each vacuum lamination instrument is successively unloaded from the loading and unloading apparatus, and transferred into the taking-out work area 461. In the taking-out work area, the vacuuming space of each vacuum lamination instrument is returned to atmospheric pressure, followed by removing the silicone rubber sheet. The stacked body, having been subjected to thermocompression bonding treatment into a solar cell module in each vacuum lamination instrument, is taken out from the vacuum lamination instrument, together with the filler interning material, whereby a plurality of solar cell modules are obtained at the same time. By this, the entire vacuum lamination treatment process is completed.

By repeating the above procedures, mass vacuum lamination treatment is enabled to mass-produce a solar cell module.

In order to efficiently conduct the vacuum lamination treatment using the vacuuum lamination treatment system shown in FIG. 4, there are points to be taken into consideration as will be described below.

A first point is the number of the vacuum lamination instruments to be used. When a pile of usable vacuum lamination instruments is considered to be one set, it is desired to provide four sets, one for the taking-out work area and the material-stacking work area, one for the provisionally vacuuming work area, one for the heating work area, and one for the cooling work area. By providing four sets, one set of the vacuum lamination instruments is subjected to the corresponding treatment in every work area, and therefore, there is no work area in a stand-by condition.

A second point is to standardize the treating times in the respective work areas. For instance, on the basis of the treating time required in the heating work area, the treating time in the provisionally vacuuming work area and that in the cooling work area are standardized, where the entire processes can be completed at the same time, whereby labor saving can be made and complexity can be prevented. For this, the performance of the cooling fan and/or the performance of the vacuuming means are necessary to be adequately adjusted. With respect to the taking-out work area and the material-stacking work area, by properly adjusting the number of workers engaged in these works, it is possible to make the treating times in these work areas correspond those in other work areas.

Incidentally, the work in the material-stacking work area may be conducted by a mechanical manner, a manual manner, or a combination of these manners. However, an optimum manner should be properly determined in view of automatization and cost balance so as to satisfy the above tact times.

Herein, it should be understood that the present invention is not limited to the above described embodiment, but the embodiment can be properly modified. For instance, in the above described embodiment based on FIG. 4, the container for transporting the members to be stacked has been described, but the container is not always necessarily used.

Figure 5:
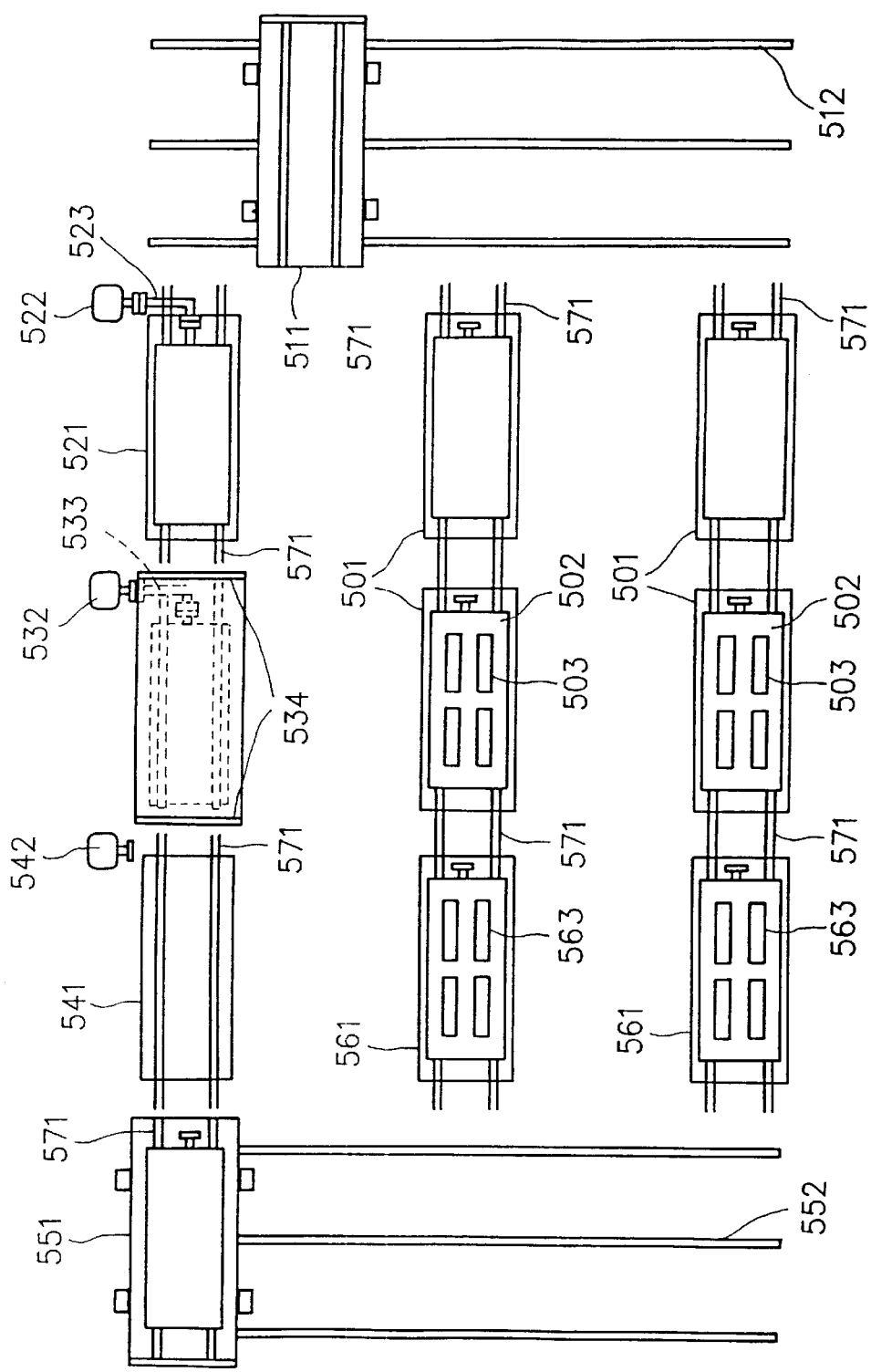
FIG. 5 is a schematic arrangement plan illustrating a modification of the embodiment shown in FIG. 4.

In FIG. 5, there is shown another typical embodiment of the continuous vacuum lamination treatment system according to the present invention. The embodiment shown in FIG. 5 comprises a modification of the embodiment shown in FIG. 4, in which the single array comprising the taking-out work area and the material-stacking work area in the system shown in FIG. 4 is changed into double arrays each comprising the taking-out work area and the material-stacking work area so as to cope with a great increase in the number of a set of members to be laminated for the production of a solar cell module.

In FIG. 5, reference numeral 501 indicates a material-stacking work area, and reference numeral 502 a vacuum lamination instrument having the same constitution as the vacuum lamination instrument shown in FIG. 1. In this material-stacking area, a plurality of members 503 to be laminated are stacked to form a stacked body on the vacuum lamination instrument: 502.

Reference numeral 511 indicates a loading and unloading apparatus which has the same constitution as the loading and unloading apparatus shown in FIG. 2. And reference numeral 521 indicates a provisionally vacuuming work area. The loading and unloading apparatus 511 can move along a rail 512 to neighbor to both the material-stacking work area 501 and the vacuuming work area 521.

In the vacuuming work area 521, a vacuuming pump 522 and a detachable flexible vacuuming hose 523 are provided.

Reference numeral 531 indicates a heating work area which substantially comprises a heating oven. The heating oven herein has a space capable of accommodating a body comprising a necessary number of vacuum lamination instruments being loaded therein. The heating even is provided with a door 534 at each of the opposite ends. Reference numeral 532 indicates a vacuuming pump. The vacuuming pump 532 is connected to a flexible vacuuming hose 533 which penetrates the wall of the heating oven to extend in the heating oven and which can be optionally connected to and detached from the vacuum lamination instrument.

Reference numeral 541 indicates a cooling work area which is provided with a vacuuming pump 542. Reference numeral 551 indicates a loading and unloading apparatus having the same constitutions as the loading and unloading apparatus shown in FIG. 2. Reference numeral 461 indicates a taking-out work area.

The loading and, unloading apparatus 551 can move along a rail 552 to neighbor both the cooling work area 541 and the taking-out area 561.

Reference numeral 563 indicates a solar cell module obtained as a result of the vacuum lamination treatment. The solar cell module 563 is taken out from the vacuum lamination instrument in the taking-out work area 561.

Reference numeral 571 indicates a conveyor having a circular roller. The conveyor 571 is provided between every adjacent work area so that either a single vacuum lamination instrument or a pile of plural vacuum lamination instruments can freely travel between the adjacent work areas.

The system shown in FIG. 5 is designed such that the loading and unloading apparatus 511 and 551 can move respectively along an extension of the rail 512 and an extension of the rail 552 to neighbor the double arrays each comprising the taking-cut work area 561 and the material-stacking work area 501.

Features other than those described above are the same as in the case of the system shown in FIG. 4, and therefore, explanation of them has been omitted.

For the loading and unloading apparatus used in any of the above described systems, it is not always necessary to be of the type shown in FIG. 2. The loading and unloading apparatus can be replaced by a means of piling the vacuum lamination apparatus from above using a hoist, for example.

As previously described, the present invention includes a vacuum lamination apparatus usable as the vacuum lamination instrument; in the continuous vacuum lamination treatment system according to the present invention.

A typical embodiment of the vacuum lamination apparatus comprises (i) a vacuuming pipe comprising a looped hollow pipe having a plurality of vents spacedly arranged on an inside circumference thereof, (ii) a mounting table to which said vacuuming pipe is fixed, and (iii) a sheet-like covering member, wherein said covering member (iii) is superposed over the front surface of said mounting table (ii) while covering said vacuuming pipe (i) to form a vacuuming space circumscribed by said covering member, said vacuuming pipe and the front surface of said mounting table, characterized in that the vacuuming pipe is fixed to the mounting table by means of intermittently welded portions provided at a contact region between the mounting table and the vacuuming pipe and a sealant disposed to the entire of said contact region.

FIGS. 6 to 9 are schematic diagrams showing procedures for fixing a vacuuming pipe to a mounting table in the fabrication of a vacuum lamination apparatus according to the present invention.

In FIGS. 6 to 9, reference numeral 601 indicates a vacuuming pipe, and reference numeral 602 a base plate as a mounting table which comprises a metallic plate having a front surface of 0.2 to 1.5 $\mu$m in a center line average height. Reference numeral 603 indicates a partially welded portion (which is welded by means of spot welding). Reference numeral 604 indicates a sealant as a fixing material, reference numeral 605 a vent, and reference numeral 606 a flange through which the vacuuming pipe 601 is connected to a vacuuming pump (not shown).

In the following, description will be made of an example of the vacuuming lamination apparatus with reference to FIGS. 6 to 9.

Figure 6:
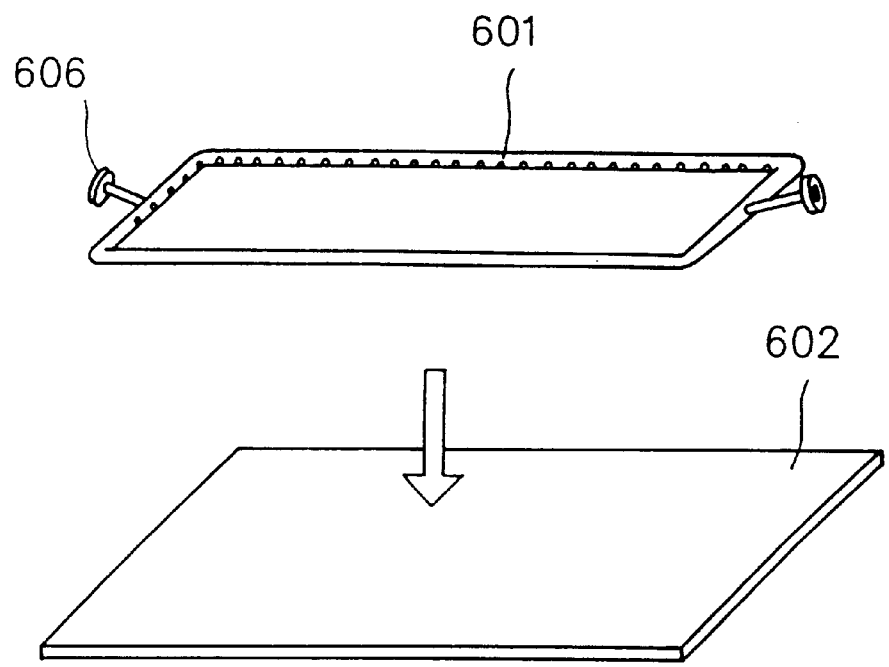
FIG. 6 is a schematic diagram for explaining a first step in the preparation of a vacuum lamination apparatus according to the present invention.

First, as shown in FIG. 6, the vacuuming pipe 601 is arranged on a predetermined position of the front surface of the base plate 602 as the mounting table. Then, as shown in FIG. 7, spot welding is conducted between the vacuuming pipe 601 and the base plate 602 as the mounting table, whereby the vacuuming pipe is fixed to the front surface of the mounting table by means of intermittently welded partial portions 603.

Figure 7:
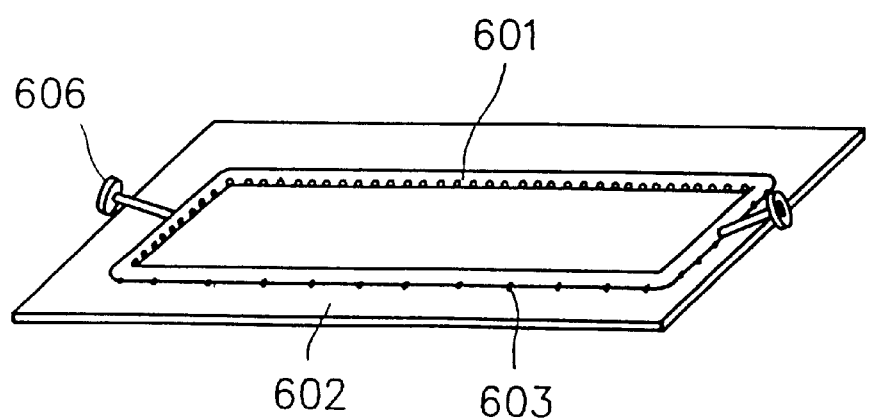
FIG. 7 is a schematic diagram for explaining a second step in the preparation of the vacuum lamination apparatus according to the present invention.
Figure 8:
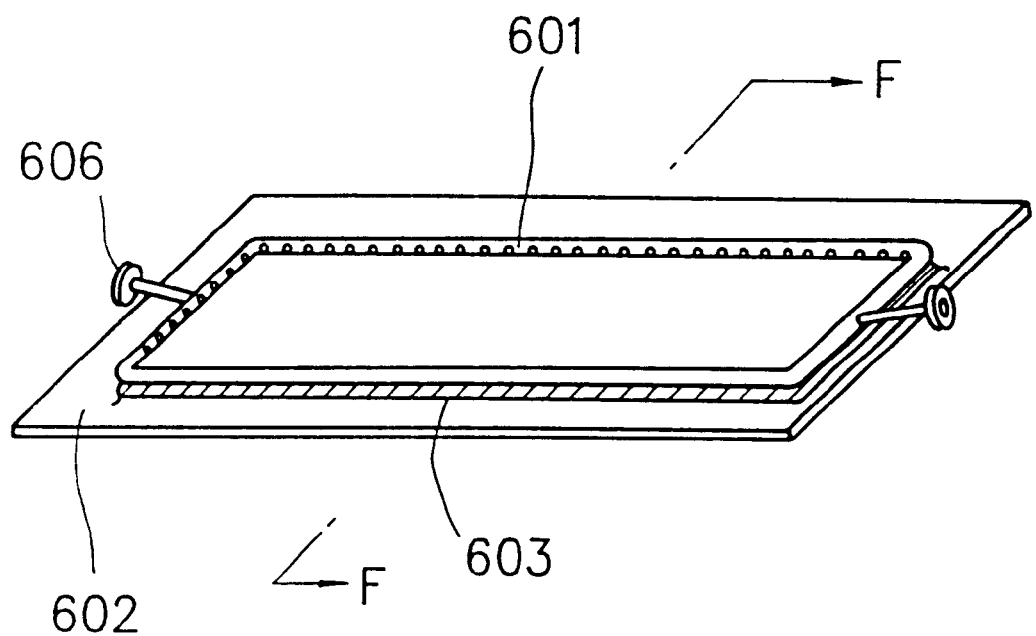
FIG. 8 is a schematic diagram for explaining a third step in the preparation of the vacuum lamination apparatus according to the present invention.

Successively, as shown in FIG. 8, a fixing material 604 comprising a sealant is applied so as to fill clearances between the vacuuming pipe 601 and the front surface of the base plate 602 as the mounting table, which have been established as a result of the spot welding in FIG. 7. The fixing material 604 thus applied functions not only to fix the vacuuming pipe 601 to the mounting table 602 but also to serve as a vacuum-sealing means when a space circumscribed by the vacuuming pipe 601, the front surface of the mounting table 602 and the foregoing sheet-like covering member (not shown). Therefore, the application of the sealant is required to apply to the entire contact region between the vacuuming pipe and the front surface of the base plate (as the mounting table) so that the clearances between the vacuuming pipe 601 and the front surface of the base plate 601, which have been established as a result of the spot welding, are sufficiently filled by the sealant.

The resultant obtained in the step of FIG. 8 is maintained in an atmosphere with room temperature for about 24 hours to solidify the applied sealant. By this, a vacuum lamination apparatus is completed.

Figure 9:
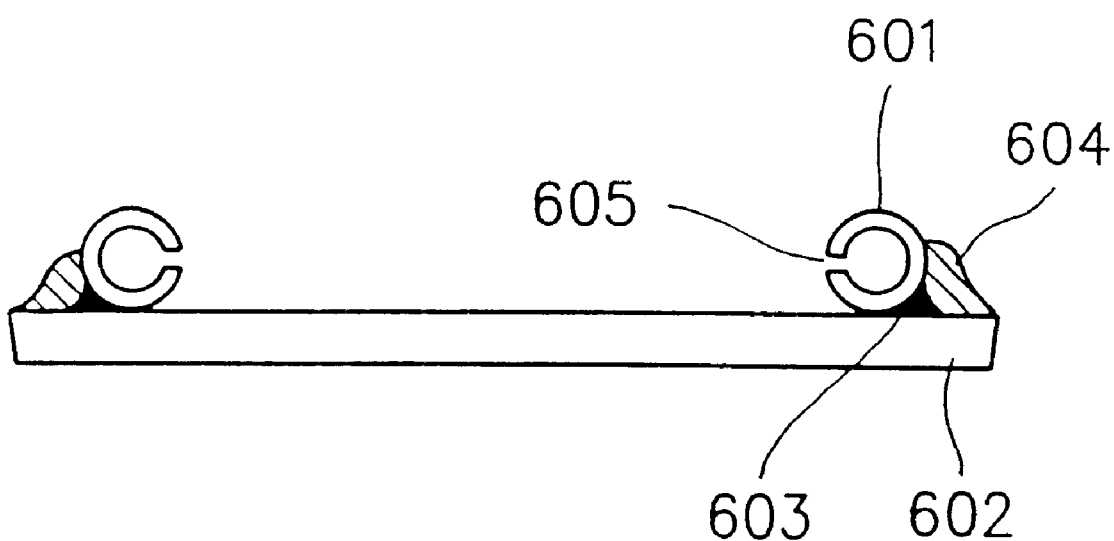
FIG. 9 is a schematic cross-sectional view, taken along the F—F line in FIG. 8.

FIG. 9 is a schematic cross-sectional view of the resultant vacuum lamination apparatus, taken along the line F—F in FIG. 8.

For the above intermittently welded partial portions in the step of FIG. 7, it is desired for them to be established at an interval of preferably 1 to 100 cm or more preferably 5 to 50 cm. In the case where the welding interval is excessively small, there is provided such a state that is substantially the same in the case where the entire contact region between the vacuuming pipe 601 and the front surface of the base plate 602 as the mounting table is welded, where a problem may entail a welding distortion occurrence to distort the resulting vacuum lamination apparatus. On the other hand, in the case where the welding interval is excessively large, especially when the base plate 601 as the mounting table is lifted, the base plate as the mounting table is often distorted to cause a clearance between the base plate 602 (as the mounting table) and the vacuuming pipe 601 whereby cracking the fixing material 604 comprising the sealant, resulting in the vacuum lamination apparatus being unusable in practice.

In any case, when the vacuuming pipe 601 is spot-welded to the base plate 602 as the mounting table, at least a given surface area of the base plate which is subjected to welding is necessary to be in a weldable state with no coating material prior to conducting the welding.

As above described, as the base plate 602 as the mounting table, a metallic plate, having a front surface of 0.2 to 1.5 $\mu$m in center line average height onto which the vacuuming pipe 601 is to be fixed is used. This is due to the following reasons.

When the center line average height is less than 0.2 $\mu$m, the surface of the metallic plate is smooth such that a sufficient adhesion cannot be attained between the surface of the base plate and the sealant. When the adhesion between the surface of the base plate and the sealant is insufficient, even in the case where the surface of the base plate has been previously spot-welded with the vacuuming pipe, the bonded portion comprising the sealant is liable to remove when the vacuum lamination apparatus is greatly distorted.

When the center line average height is beyond 1.5 $\mu$m, it is difficult for recesses of the irregularities present at the surface of the base plate to be filled by the sealant so as to sufficiently seal between the surface of the base plate and the vacuuming pipe. When the sealing between the surface of the base plate and the vacuuming pipe is insufficient, a practically usable vacuum lamination apparatus cannot be attained.

Specific examples of the metallic plate used as the base plate 602 as the mounting table are iron plate, steel plates including stainless steel plate, aluminum plate, and the like. Of these, a galvanized steel plate is the most appropriate for the reasons that it excels in weatherability, it can be readily made have a surface of 0.2 to 1.5 $\mu$m in center line average height, it can be readily made to have a large surface, and it is commercially available at reasonable cost. In addition, the galvanized steel plate has a further advantage in that it can be readily made to have a surface excelling in adhesion by way of surface treatment with the use of phosphate.

It is desired for the thickness of the base plate 602, as the mounting table, to be thin in order to make it light weight. However, when the thickness is excessively small, the base plate is inferior in rigidity. In order for the weight and the rigidity to be well balanced, the base plate is desired to have a thickness preferably in the range of 0.3 to 3 mm or more preferably in the range of 1.5 to 2.0 mm.

The vacuuming pipe 601 is required to be heat resistant, rigid and light weight. In view of this, the vacuuming pipe is usually constituted principally by a stainless steel. The vacuuming pipe 601 is provided with a plurality of vents 605 spacedly perforated at the inner circumference side thereof. These vents are desired to be perforated at the vacuuming pipe prior to the fabrication of a vacuum lamination apparatus.

For the dimension of the vacuuming pipe 601, it is made such that the outer frame of the vacuuming pipe is desirably accommodated within the front surface of the base plate 602 as the mounting table. In addition, the vacuuming pipe 601 is provided with an opening connected to a vacuuming pump (not shown).

In the following, another example of the vacuum lamination apparatus according to the present invention will be described with reference to FIGS. 10(a) and 10(b).

Figure 10A:
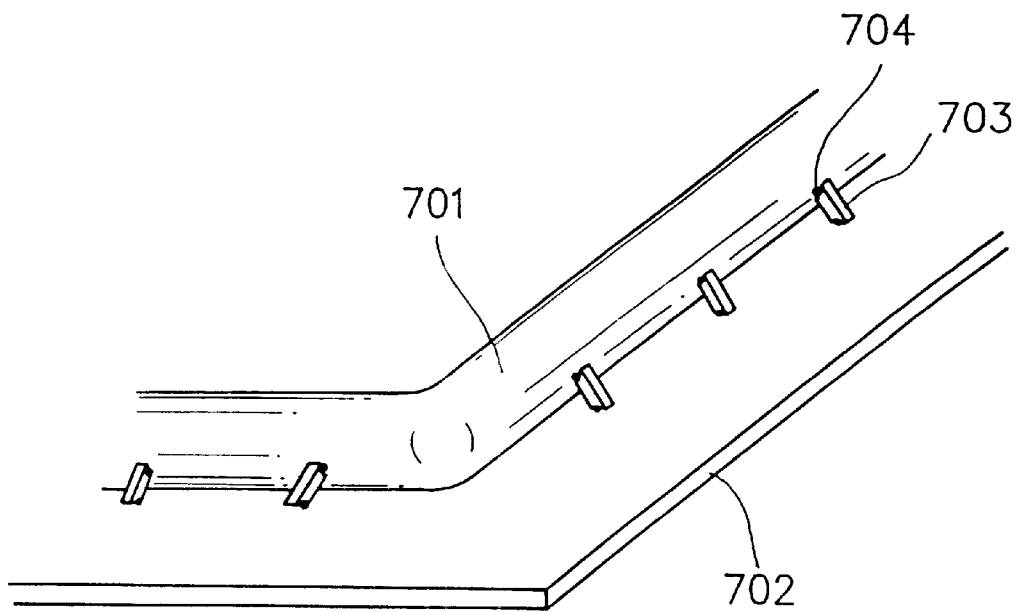
FIGS. 10(a) and 10(b) are schematic views for explaining another embodiment for the preparation of a vacuum lamination apparatus according to the present invention.
Figure 10B:
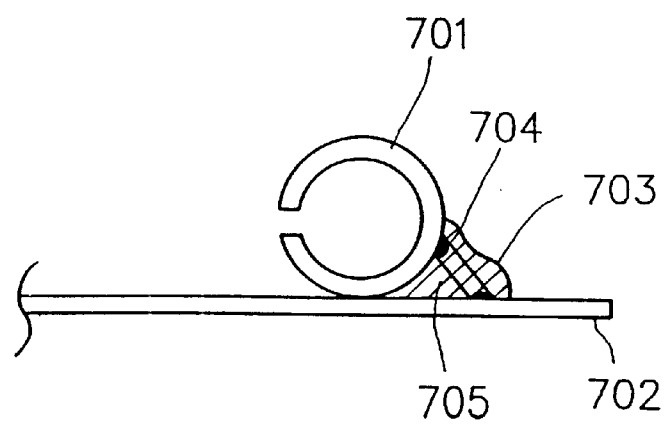

FIGS. 10(a) and 10(b) are schematic diagrams showing procedures for fixing a vacuuming pipe to a mounting table in the fabrication of a vacuum lamination apparatus according to the present invention.

In FIGS. 10(a) and 10(b), reference numeral 701 indicates a vacuuming pipe, reference numeral 702 a base plate as a mounting table, reference numeral 703 a connection member to be welded, reference numeral 704 a welded portion, and reference numeral 705 a sealant as a fixing material.

The fabrication of a vacuum lamination apparatus shown in FIGS. 10(a) and 10(b) is conducted in the same manner as in the case shown in FIGS. 6 to 9. Particularly, the vacuuming pipe 701 is arranged on a predetermined position of the front surface of the base plate 702 as the mounting table (see, FIG. 10(a)). Then, as shown in FIG. 10(a), a plurality of connection members 703 are spacedly welded to both the vacuuming pipe 701 and the base plate 702, whereby the vacuuming pipe is fixed to the surface of the base plate through the connection members. The welded portions herein are as shown by reference numeral 704 in FIG. 10(b). Successively, a fixing material 705 comprising a sealant is applied so as to fill clearances between the vacuuming pipe 701 and the surface of the base plate 702 as the mounting table, as shown in FIG. 10(b).

The resultant obtained by the above description is maintained in an atmosphere with room temperature for about 24 hours to solidify the applied sealant. By this, a vacuum lamination apparatus is completed.

The present invention will be described in more detail with reference to the following examples, which are not intended to restrict the scope of the present invention.

EXAMPLE 1

[Continuous Vacuum Lamination Treatment System]

In this example, the continuous vacuum lamination treatment system according to the present invention was practiced as will be described below.

In this example the apparatus shown in FIGS. 1, 2 and 4 were used.

Figure 11:
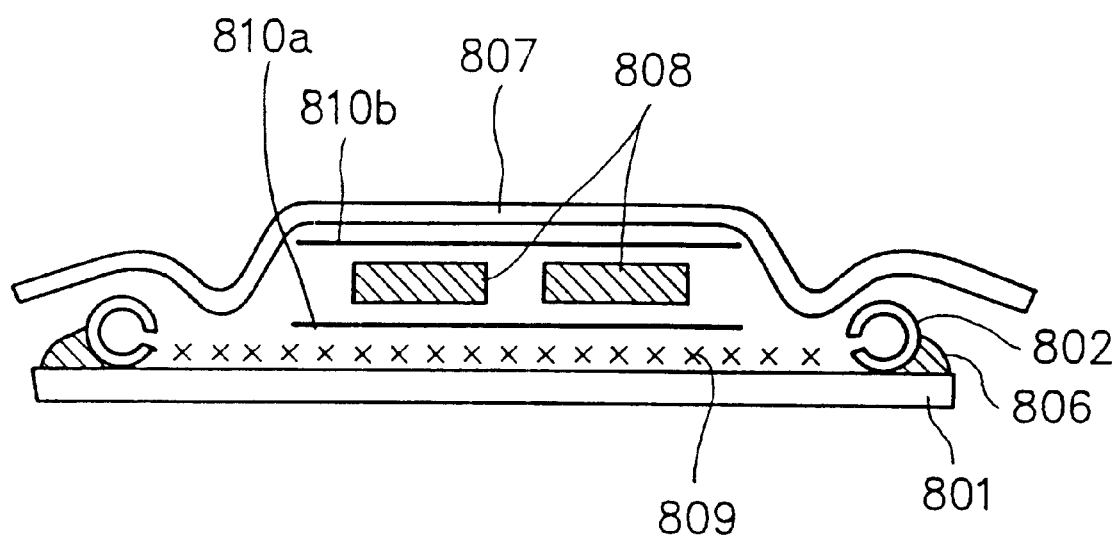
FIG. 11 is a schematic view for explaining an embodiment of stacking members, which is conducted on the vacuum lamination instrument in the continuous vacuum lamination treatment system according to the present invention.

The formation of a stacked body comprising necessary members for production of a solar cell module was conducted in accordance with a stacking manner shown in FIG. 11.

In FIG. 11, reference numeral 801 indicates a base plate serving as a mounting table. The base plate 801 comprises a weatherproofed steel plate 1.6 mm thick and 1450 mm×6000 mm in size and having a surface treated by phosphate (trademark name: BONDE STEEL PLATE, produced by Shin-Nippon Steel Co., Ltd.).

On the phosphate-treated surface (hereinafter referred to as front surface) of the steel plate as the base plate 801, a looped vacuuming pipe 802 of 1400 mm×5950 mm in outer size having a plurality of vents spacedly perforated at its inner circumference side is arranged while being fixed by means of an RTV type silicone sealant 806 (trade name: SILICONE SEALANT KE346, produced by Shin-Etsu Silicone Kabushiki Kaisha).

In the surface region of the front surface of the base plate 801 which is circumscribed by the vacuuming pipe 802, there is laid a wire-netting 809 comprising a stainless steel wire-netting of a stainless of 0.6 mm in wire diameter and 1350 mm×5900 mm in size (produced by Taiyo Kana-Ami Kabushiki Kaisha) in order to establish a deaeration passage. On the wire-netting 809, there is laid a lower filler antirunning member 810a for a back side filler member (not shown in the figure) which is used in a solar cell module. The antirunning member 810a comprises a PTFE film (produced by Asahi Glass Co., Ltd.: of 1300 mm×5800 mm in size.

The base plate 801 as the mounting table is positioned on the container 111 in FIG. 1. The container 111 herein is 1600 mm×6100 mm in size and 200 mm in height.

A combination of the mounting table 801, the vacuuming pipe 802, the wire-netting 809 and the lower filler antirunning member 810a will be hereinafter referred to as "vacuum lamination instrument". This combination (that is, the vacuum lamination instrument) is recycled several times without decomposing.

Figure 13A:
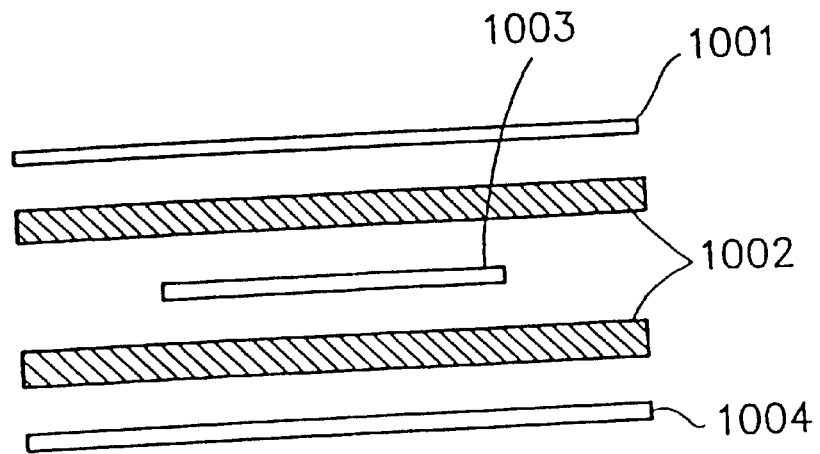
FIGS. 13(a) and 13(b) are schematic views illustrating the configuration of an example of a solar cell module.
Figure 13B:
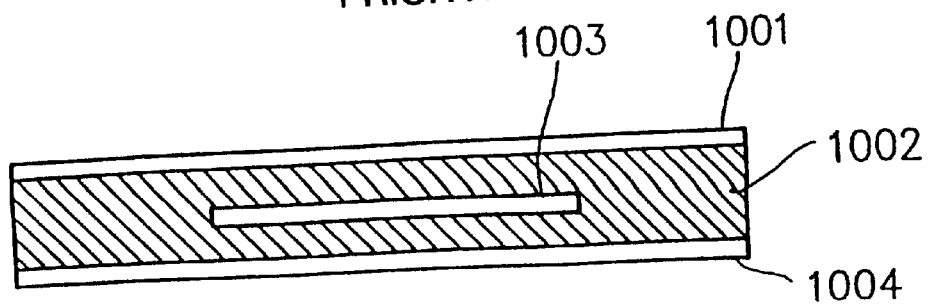
Figure 14A:
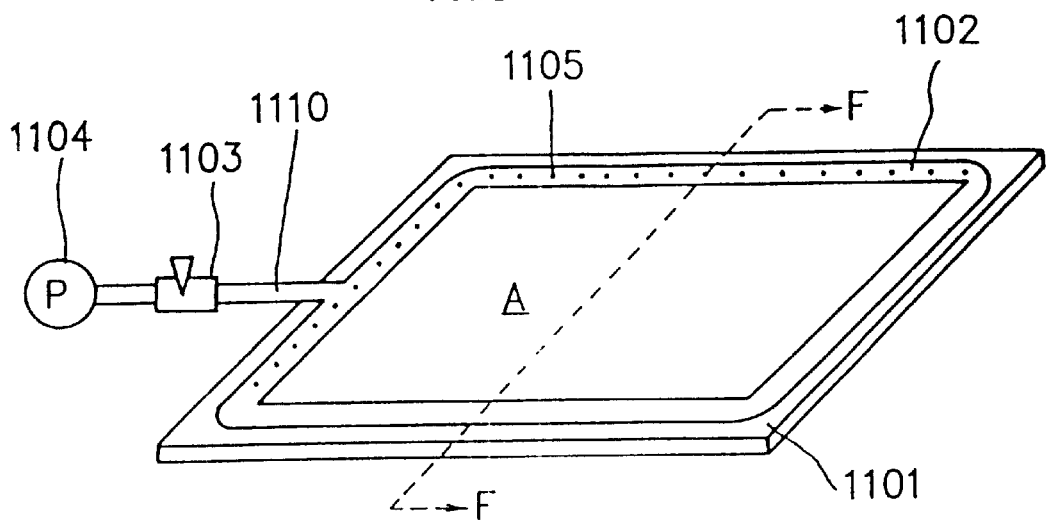
FIGS. 14(a) through 14(c) are schematic diagrams illustrating a conventional vacuum lamination apparatus which is used for the production for a solar cell module.
Figure 14B:
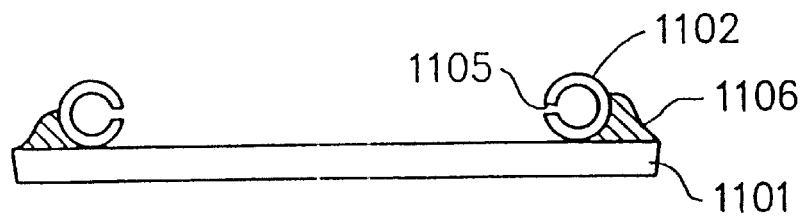
Figure 14C:
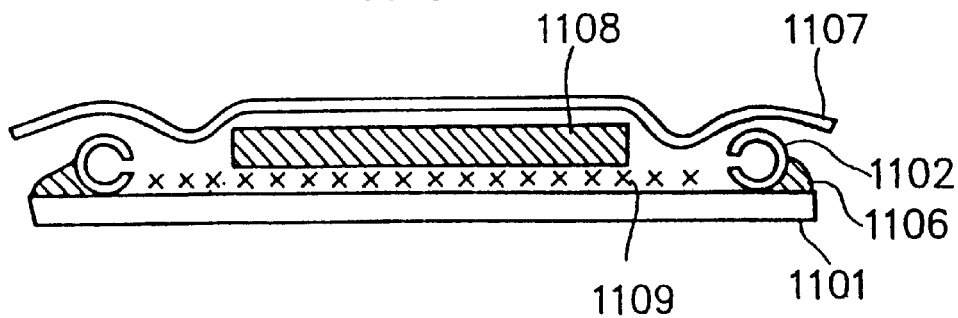

Now, on the lower filler antirunning member 810a of the vacuum lamination instrument, necessary members for the production of a solar cell module were laminated to form a stacked body 808. These necessary members used were the same as those shown in FIG. 13, explanation of which has been previously made. Particularly, the following members (1) to (5) were stacked in the named order:

(1) a back side covering member comprising a weathering resistant precoated steel plate 0.4 mm thick and 500 mm×1400 mm in size (trademark name: Taima Color GL, produced by Daido Kohan Kabushiki Kaisha), (2) a back side filler member comprising an EVA sheet 50 $\mu$m thick and 500 mm×1400 mm in size (trademark name: Weathering Reistcnt Grade, produced by Haisheet Kabushiki Kaisha), (3) a solar cell, (4) a surface side filler member comprising an EVA sheet 50 $\mu$m thick and 500 mm×1400 mm in size (trademark name: Weathering Reistant Grade, produced by Haisheet Kabushiki Kaisha), and.

(5) a surface side covering member comprising a fluororesin film 50 $\mu$m thick and 500 mm×1400 mm in size (trademark name: Tefzel, produced by E.I. du Pont Company).

In this way, on one vacuum lamination instrument, there were formed 8 stacked bodies each having a size of 500 mm×1400 mm corresponding to the size of a solar cell module to be produced. These E; stacked bodies were arranged in two rows each containing 4 stacked bodies arranged in a line. These 8 stacked bodies will be hereinafter collectively referred to as the "stacked body".

After the above stacking step, an upper filler antirunning member 810b (comprising a PTFE film (produced by Asahi Glass Co., Ltd.) of 1300 mm×5800 mm in size) was laminated on the surface covering member of the stacked body, followed by superposing a silicone rubber sheet 807 (produced by Tigerspolymer Company) 2 mm thick and 1550 mm×6100 mm in size over the resultant.

The above stacking process was conducted in the material-stacking work area 401 shown in FIG. 4.

Immediately after the above stacking process for the one vacuum lamination instrument was completed, the vacuum lamination instrument was transported into the loading and unloading apparatus 411 shown in FIG. 4, where it was loaded in the loading and unloading apparatus.

In this example, six vacuum lamination instruments each having the stacked body comprising 8 stacked bodies formed in the foregoing manner were loaded in the loading and unloading apparatus. The period of time spent for the stacked body formation on the six vacuum lamination instruments was 45 minutes.

The pile of the six vacuum lamination instruments was transported in the provisionally vacuuming work area 421 shown in FIG. 4, where vacuuming was conducted in the same manner as previously described in the foregoing description of the system shown in FIG. 4.

As the vacuuming pump in this case, there was used a D-330 type vacuuming pump (produced by ULVAC Company), and the vacuuming was conducted for 40 minutes. The vacuum degree in each vacuum lamination instrument after the vacuuming for 40 minutes was found to be about 1 Torr at a position right above the vacuuming pump.

After the vacuuming treatment conducted as above described, the pile of the six vacuum lamination instruments was transported into the heating oven in the heating work area 431 shown in FIG. 4, where while continuing the vacuuming operation, all the stacked bodies on the six vacuum lamination instruments were subjected to thermocompression bonding treatment at 160° C. for 50 minutes.

After the thermocompression bonding treatment in the heating work area 431, the pile of the six vacuum lamination instruments was transported into the cooling work area 441 shown in FIG. 4, where while continuing the vacuuming operation, cold air was forcibly blown to all the stacked bodies on the six vacuum lamination instruments by means of a fan (not shown) for 30 minutes, whereby all the stacked bodies on the six vacuum lamination instruments were cooled to a temperature such that a worker could freely touched them by his hands.

Thereafter, the pile of the six vacuum lamination instruments was transported into the loading and unloading apparatus 451, where each of the six vacuum lamination instruments was separately unloaded, followed by transferring into the taking-out work area 461. In the taking-out work area 461, the stacked body (comprising 8 stacked bodies) having been subjected to the vacuum lamination treatment was taken out from each of the six vacuum lamination instruments in accordance with the following procedures: (i) the silicone rubber sheet is removed, (ii) successively the upper filler antirunning member is removed, and (iii) finally the stacked body having been subjected to the vacuum lamination treatment is taken out.

By this, 48 solar cell modules [8 (8 stacked bodies on one vacuum lamination instrument)×6 (6 vacuum lamination instruments)] were obtained.

The lower filler antirunning member and wire-netting were not removed since they can be recycled in the next vacuum lamination treatment.

For the resultant solar cell modules, evaluation was conducted with respect to exterior appearance and the presence or absence of layer peeling. As a result, it was found that they are satisfactory in exterior appearance and have no layer peeling. In addition, for these solar cell modules, evaluation was conducted with respect to solar cell characteristics. As a result, it was found that they have satisfactory solar cell characteristics.

Now, the period of time spent in each step in this example was as follows.

Stacking step: 45 minutes,
Provisionally vacuuming step: 40 minutes,
Heat treatment step: 50 minutes,
Cooling treatment step: 30 minutes, and
Taking-out step: 10 minutes.

From this, it is understood that the sum of the period of time spent in the taking-out step and that spent in the stacking step is 55 minutes. The effective period of time obtained by adding the amount of time spent connecting and detaching the flexible vacuuming hoses to the 50 minutes spent in the heat treatment step was about 55 minutes.

Hence, in this example, it is understood that the vacuum lamination instrument proceeds with a tact time of about 55 minutes for the corresponding step. In addition, when considering an 8 hour working day, it is considered that 8 batches of the vacuum lamination treatment can be conducted per day. In this respect, it can be said that the production of 8×6×8=384 solar cell modules per day can be achieved. In the case where a three-workers alternate working system is employed, it is considered that the production of about 1100 solar cell modules per day, which corresponds about 3 times the foregoing solar cell module production, can be achieved.

EXAMPLE 2

[Continuous Vacuum Lamination Treatment System]

In this example, the continuous vacuum lamination treatment system according to the present invention was practiced in a manner similar to that in Example 1, as will be described below.

In this example, the apparatus shown in FIGS. 1, 2 and 5 were used. Particularly, the procedures employed in this example is the same as those employed in Example 1, except that the apparatus shown in FIG. 4 used in Example 1 is changed to the apparatus shown in FIG. 5 which is a modification of the apparatus shown in FIG. 4, in which double arrays each comprising the taking out work area and the material-stacking work area are arranged instead of the single array comprising the taking-out work area and the material-stacking work area in the apparatus shown in FIG. 4.

For the constituents, container, vacuuming pipe and the like relating to the vacuuming instrument, they were made the same as those used in Example 1.

In this example, the procedures of Example 1 for the production of a solar cell module were repeated, except for changing the sizes of the sealing members used upon the formation of a stacked body for a solar cell module in Example 1 so that a stacked body capable of producing a solar cell module having a size of 300 mm×650 mm, which is about ½ of that of the solar cell produced in Example 1, can be obtained. Particularly, the following members (1) to (5) were stacked in the named order.

(1) a back side covering member comprising a weathering resistant precoated steel plate 0.4 mm thick and 300 mm×650 mm in size (trademark name: Timer Color GL, produced by Daido Kohan Kabushiki Kaisha), (2) a back side filler member comprising an EVA sheet 50 μm thick and 300 mm×650 mm in size (trademark name: Weathering Reistant Grade, produced by Haisheet Kabushiki Kaisha), (3) a solar cell, (4) a surface side filler member comprising; an EVA sheet 50 μm thick and 300 mm×650 mm in size (trademark name: Weathering Reistant Grade, produced by Haisheet Kabushiki Kaisha), and (5) a surface side covering member comprising a fluororesin film 50 μm thick and 300 mm×650 mm in size (trademark name: Tefzel, produced by E.I. du Pont Company).

In this way, on one vacuum lamination instrument, there were formed 16 stacked bodies each having a size of 300 mm×650 mm, corresponding to the size of a solar cell module to be produced.

The period of time spent for the stacked body formation on one vacuum lamination instrument was about two times that in Example 1, because the number of stacked bodies (each for a solar cell module) formed on the vacuum lamination instrument was two times that in Example 1. However, because the double arrays each comprising the taking-out work area and the material-stacking work area were used in this example, the formation of a large number of stacked bodies for the mass-production of a solar cell module could be conducted for a reasonable stacking period of time. The period of time spent for the stacked body formation on the three vacuum lamination instruments loaded was 45 minutes.

In this example, the loading and unloading apparatus was reciprocated between the two material-stacking work areas, of the double arrays while loading six vacuum lamination instruments.

Except for the foregoing points, the entire vacuum lamination treatment process was conducted in the same manner as in Example 1.

For the resultant solar cell modules, evaluation was conducted with respect to exterior appearance and the presence or absence of layer peeling. As a result, it was found that they are satisfactory in exterior appearance and have no layer peeling. In addition, for these solar cell modules, evaluation was conducted with respect to solar cell characteristics. As a result, it was found that they have satisfactory solar cell characteristics.

As apparent from the results in Examples 1 and 2, it is understood that according to the continuous vacuum lamination treatment system of the present invention, a desirable solar cell module can be efficiently mass-produced at a high throughput while taking full advantage of the heating oven.

EXAMPLE 3

[Vacuum Lamination Apparatus]

In this example, a vacuum lamination apparatus, according to the present invention in the manner shown in FIGS. 6 to 9 was fabricated. In this case, those materials mentioned in the foregoing description with reference to FIGS. 6 to 9 were used.

In this example, a vacuuming pipe 601 was arranged on a predetermined position within the front surface of a base plate 602 as a mounting table. Then, spot welding was conducted between the vacuuming pipe 601 and the base plate 602 at an interval of 15 cm, whereby the vacuuming pipe was fixed to the front surface of the base plate by means of the resultant intermittently welded partial portions 603. Then, a sealant 604 was poured between the vacuuming pipe and the front surface of the base plate from the outside so as to fill clearances between the vacuuming pipe and the front surface of the base plate, which had been established as a result of the above spot welding.

As the base plate 602, a galvanized steel plate of 1.6 mm and 1450 mm×6000 mm in size and having a front surface of about 0.8 μm in center line average height was used. As the vacuuming pipe 601, a looped vacuuming pipe made of a stainless steel 316BA (trade name) and having an outer size of 1450 mm×5950 mm and an internal diameter of ½ inch was used. And the looped vacuuming pipe is provided with a plurality of vents of 3 mm in void size spacedly perforated at its inner circumference side at an interval of 50 mm. As the sealant 604, an RTV type silicone sealant (trade name: SILICONE SEALANT KE346, produced by Shin-Etsu Silicone Kabushiki Kaisha) was used.

After the silicone sealant had been poured as above described, the resultant was maintained in an atmosphere with room temperature for 24 hours to solidify the silicone sealant. By this, there was obtained a vacuum lamination apparatus.

The vacuum lamination apparatus thus obtained was carried several times while handling its four corners. But the sealant applied between the vacuuming pipe and the base plate never suffered from problems such as cracking.

COMPARATIVE EXAMPLE 1

[Vacuum Lamination Apparatus]

In this comparative example, a vacuum lamination apparatus was fabricated as will be described below.

A vacuuming pipe 601 was arranged on a predetermined position within the front surface of a base plate 602 as a mounting table. Without conducting welding between the vacuuming pipe 601 and the base plate 602, a sealant 604 was poured between the vacuuming pipe and the front surface of the base plate from the outside so as to fill the clearance between the vacuuming pipe and the front surface of the base plate.

As the base plate 602, there was used a galvanized steel plate of 1.6 mm and 1450 mm×6000 mm in size and having a front surface of about 0.9 $\mu$m in center line average height. A looped vacuuming pipe made of a stainless steel 316BA (trade name) and having an outer size of 1450 mm× 5950 mm and an internal diameter of ½ inch was used as the vacuuming pipe 601. The looped vacuuming pipe is provided with a plurality of vents of 3 mm in void size spacedly perforated at its inner circumference side at an interval of 50 mm. As the sealant 604, an RIV type silicone sealant (trade name: SILICONE SEALANT KE346, produced by Shin-EtEsu Silicone Kabushiki Kaisha) was used.

After the silicone sealant had been poured as above described, the resultant was maintained in an atmosphere with room temperature for 24 hours to solidify the silicone sealant. By this, there was obtained a vacuum lamination apparatus.

The vacuum lamination apparatus thus obtained was carried several times while handling its four corners. As a result, the sealant applied between the vacuuming pipe and the base plate was apparently cracked. In this case, the base plate was distorted by about 15 cm.

COMPARATIVE EXAMPLE 2

[Vacuum Lamination Apparatus]

In this comparative example, a vacuum lamination apparatus was fabricated as will be described below.

A vacuuming pipe 601 was arranged on a predetermined position within the front surface of a base plate 602 as a mounting table. Then, spot welding was conducted between the vacuuming pipe 601 and the base plate 602 at an interval of 15 cm, whereby the vacuuming pipe was fixed to the front surface of the base plate by means of the resultant intermittently welded partial portions 603. Then, a sealant 604 was poured between the vacuuming pipe and the front surface of the base plate from the outside so as to fill clearances between the vacuuming pipe and the front surface of the base plate, which had been established as a result of the above spot welding.

As the base plate 602, a galvanized steel plate of 1.6 mm and 1450 mm×6000 mm in size and having a front surface of about 0.1 $\mu$m in center line average height was used. As the vacuuming pipe 601, a looped vacuuming pipe made of a stainless steel 316BA (trade name) and having an outer size of 1450 mm×5950 mm and an internal diameter of ½ inch was used. The looped vacuuming pipe is provided with a plurality of vents of 3 mm in void size spacedly perforated at its inner circumference side at an interval of 50 mm. As the sealant 604, an RTV type silicone sealant (trade name: SILICONE SEALANT KE346, produced by Shin-Etsu Silicone Kabushiki Kaisha) was used.

After the silicone sealant had been poured as above described, the resultant was maintained in an atmosphere with room temperature for 24 hours to solidify the silicone sealant. By this, there was obtained a vacuum lamination apparatus.

The vacuum lamination apparatus thus obtained was carried several times while handling its four corners. As a result, distinguishable layer peeling was occurred between the sealant and the base plate.

EXAMPLE 4

[Vacuum Lamination Treatment Using the Vacuum Lamination Apparatus Fabricated in Example 1]

In this examples, the production of a solar cell module was conducted using the vacuum lamination apparatus fabricated in Example 1.

Figure 12:
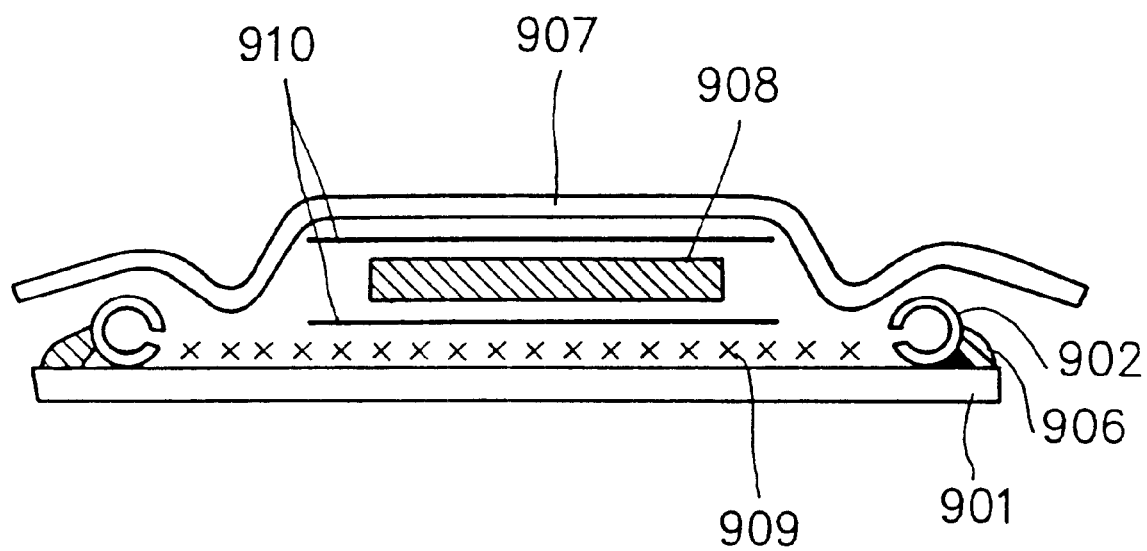
FIG. 12 is a schematic view for explaining an embodiment of using the vacuum lamination apparatus according to the present invention in the production of a solar cell module.

FIG. 12 is a schematic diagram illustrating an embodiment in the case where the vacuum lamination apparatus fabricated in Example 1 is used in the production of a solar cell module.

Particularly, FIG. 12 is a schematic cross-sectional view illustrating a configuration in that necessary members for the production of a solar cell module are stacked in a vacuum lamination treatment space established on the base plate as the mounting(table of the vacuum lamination apparatus.

In FIG. 12, reference numeral 901 indicates a base plate (comprising the vacuuming pipe 601 shown in FIGS. 6 to 9) as a mounting tab-Le, reference numeral 902 a vacuuming pipe (comprising the vacuuming pipe 601 shown in FIGS. 6 to 9), reference numeral 906 a fixing means (comprising the spot-welded portions 603 and the sealant 604 shown in FIG. 9) to fix the vacuuming pipe 902 to the front surface of the base plate 901, reference numeral 907 is a flexible covering sheet, reference numeral 908 is a stacked body formed by stacking neccessary members for the production of a solar cell module, reference numeral 909 is a wire netting, and reference numeral 910 is a filler antirunning member (comprising lower and upper filler antirunning members).

As the flexible covering sheet 907, there was provided a 2 mm thick silicone rubber sheet principally composed of a silicone resin and having a hardness of 50 (produced by Tigerpolymer Company). As the wire-netting 909, there was provided a stainless steel wire-netting of a stainless of 0.6 mm in wire diameter(produced by Taiyo Kana-Ami Kabushiki Kaisha). As the lower and upper filler antirunning members 910, there were provided two PTFE films (produced by Asahi Glass Co., Ltd.).

The production of a solar cell module was conducted in the following manner.

In the surface region of the front surface of the mounting table 901 which is circumscribed by the vacuuming pipe 902, the wire-netting 909 (the stainless steel wire-netting) was laid in order to establish a deaeration passage. On the wire-netting 909, there was laid the lower filler antirunning member 910 (the PTFE film) for a back side filler member (which will be described below) used in a solar cell module.

Then, on the lower filler antirunning member 910, the following members (1) to (5) were stacked in the named order to form a stacked body 908:

(1) a back side covering member comprising a 0.4 mm thick weathering resistant precoated steel plate (trademark name: Taima Color GL, produced by Daido Kohan Kabushiki Kaisha), (2) a back side filler member comprising a 460 $\mu$m thick EVA sheet (trademark name: Weathering Reistant Grade, produced by Haisheet Kabushiki Kaisha), (3) a solar cell, (4) a surface side filler member comprising a 460 $\mu$m thick EVA sheet (trademark name: Weathering Reistant Grade, produced by Haisheet Kabushiki Kaisha), and (5) a surface side covering member comprising a 50 $\mu$m thick fluororesin film (trademark name: Tefzel, produced by E.I. du Pont Company).

On the stacked body 908, there was laid the upper filler antirunning member 910 (the PTFE film) for the back side filler member. Successively, the flexible covering member 907 (the silicone rubber sheet) was superposed over the stacked body 908 on the mounting table 901 while hermetically sealing between the mounting table and the flexible covering member.

Then, a vacuuming pump (not shown in the figure) was actuated to exhaust the inside of the space containing the stacked body 908 between the flexible covering member 907 and the surface region of the front surface of the mounting table 901 circumscribed by the vacuuming pipe 902 through the vents of the vacuuming pipe, whereby the flexible covering member 907 is sagged toward the mounting table side to compress the stacked body 908. While operating the vacuuming pump, the lamination apparatus was introduced into a heating oven (not shown) maintained at a predetermined temperature, where the stacked body was subjected to heat treatment at a temperature of about 150° C. for 30 minutes, whereby the back side filler member and the surface side filler memmber contained in the stacked body were cured. After this, while continuing the operation of the vacuuming pump, the lamination apparatus was taken out from the oven, followed by cooling the stacked body. Then, the operation of the vacuuming pump was terminated to return the inside atmosphere of the foregoing space to atmospheric pressure. By this, there was obtained a solar cell module.

For the resultant solar cell module, evaluation was conducted with respect to exterior appearance and the presence or absence of layer paneling. As a result, it was found that the solar cell module was satisfactory in exterior appearance and has no layer peeling. In addition, for the solar cell module, evaluation was conducted with respect to solar cell characteristics. As a result, the solar cell module was found to have satisfactory solar cell characteristics.

As apparent from the above results, the vacuum lamination apparatus according to the present invention has such advantages as will be described in the following. In the vacuum lamination apparatus according to the present invention, the vacuuming pipe is firmly fixed to the base plate as the mounting table in a flexible state such that problems such as cracking are not occurred upon handling or carrying the vacuum lamination apparatus. Because of this, the vacuum lamination apparatus can be readily handle without having a particular care. Also, the vacuum lamination-apparatus can be operated at an improved operation efficiency, where the vacuum lamination treatment for a stacked body for the production of a solar cell module is efficiently conducted.

What is claimed is:

1. A vacuum lamination apparatus suitable for vacuum-laminating a stacked body, said vacuum lamination apparatus comprising:

a mounting table comprising a metal plate having a front surface on which the stacked body is to be positioned; and a vacuuming pipe comprising a looped hollow pipe having an inside circumference and a plurality of vents spacedly perforated at the inside circumference thereof, said vacuuming pipe being arranged in and fixed to the front surface of the metal plate, wherein the front surface of the metal Plate has a center line average height of 0.2 to 1.5 $\mu$m, the vacuuming pipe is fixed to the front surface of the metal plate by means of intermittently welded portions provided at a contact region between the front surface of the metal plate and said vacuuming pipe, and a sealant disposed to the entire contact region, whereby said vacuuming pipe and the metal plate are integrated.

2. A vacuum lamination apparatus according to claim 1, wherein said apparatus is used in the production of a solar cell module.

3. The vacuum lamination apparatus according to claim 1, wherein the metal plate comprises steel.

4. A process for fabricating a vacuum lamination apparatus suitable for vacuum-laminating a stacked body, the vacuum lamination apparatus comprising a mounting table having a front surface on which the stacked body is to be positioned and a vacuuming pipe comprising a looped hollow pipe having an inside circumference and a plurality of vents spacedly perforated at the inside circumference thereof, the vacuuming pipe being arranged in and fixed to the front surface of the mounting table, said process comprising the steps of:

providing a metal plate having a front surface with a center line average height of 0.2 to 1.5 $\mu$m as the mounting table;

spot-welding the vacuuming pipe to the front surface of the metal plate while contacting the vacuuming pipe to the front surface of the metal plate; and applying a sealant to an entire contact region between the vacuuming pipe and the front surface of the metal plate to integrate the vacuuming pipe and the metal plate.

5. The process according to claim 4, wherein the metal plate comprises steel.

* * * * *

UNITED STATES PATENT AND TRADEMARK OFFICE
CERTIFICATE OF CORRECTION

PATENT NO. : 6,241,839 B1
DATED : June 5, 2001
INVENTOR(S) : Takehito Yoshino et al.

It is certified that error appears in the above-identified patent and that said Letters Patent is hereby corrected as shown below:

Column 8,
Line 3, "Isle" should read -- The --.

Column 17,
Line 32, "Reistcnt" should read -- Resistant --.
Line 37, "Reistant" should read -- Resistant --.
Line 46, "E;" should read -- 8 --.

Column 19,
Lines 56 and 62, "Reistant" should read -- Resistant --.

Column 21,
Line 40, "EtEsu" should read -- Etsu --.

Column 22,
Line 44, "tab-Le," should read -- table --.

Signed and Sealed this

Fifth Day of March, 2002

*Attest:*

*Attesting Officer*

JAMES E. ROGAN
*Director of the United States Patent and Trademark Office*